(12) United States Patent
Omura

(10) Patent No.: US 8,009,271 B2
(45) Date of Patent: Aug. 30, 2011

(54) PROJECTION OPTICAL SYSTEM, EXPOSURE APPARATUS, EXPOSURE SYSTEM, AND EXPOSURE METHOD

(75) Inventor: Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 594 days.

(21) Appl. No.: 11/793,402

(22) PCT Filed: Dec. 9, 2005

(86) PCT No.: PCT/JP2005/022648
§ 371 (c)(1),
(2), (4) Date: Jun. 18, 2007

(87) PCT Pub. No.: WO2006/064728
PCT Pub. Date: Jun. 22, 2006

(65) Prior Publication Data
US 2008/0018870 A1    Jan. 24, 2008

(30) Foreign Application Priority Data
Dec. 16, 2004 (JP) .................................. 2004-364270

(51) Int. Cl.
*G03B 27/42* (2006.01)
(52) U.S. Cl. ......................................................... 355/53
(58) Field of Classification Search .... 359/211.1–211.3, 359/201.2, 202.1, 683; 355/39
See application file for complete search history.

(56) References Cited

U.S. PATENT DOCUMENTS

| | | | |
|---|---|---|---|
| 4,405,203 A | 9/1983 | Wallner et al. | |
| 4,583,846 A | 4/1986 | Nakamura et al. | |
| 5,557,469 A | 9/1996 | Markle et al. | |
| 5,614,988 A | 3/1997 | Kato et al. | |
| 5,726,739 A * | 3/1998 | Hayata | 355/67 |
| 6,172,740 B1 | 1/2001 | Suzuki | |
| 6,211,988 B1 * | 4/2001 | Engelhardt et al. | 359/201.1 |
| 6,262,793 B1 | 7/2001 | Sasaya et al. | |

(Continued)

FOREIGN PATENT DOCUMENTS

| | | |
|---|---|---|
| EP | 1 271 247 A1 | 1/2003 |
| JP | A-60-114850 | 2/1985 |
| JP | A 05-259033 | 10/1993 |
| JP | A 07-092424 | 4/1995 |
| JP | A-08-288192 | 11/1996 |

(Continued)

OTHER PUBLICATIONS

Supplementary European Search Report issued in European Patent Application No. 05814759.6 on Dec. 7, 2010.
Jan. 25, 2011 Office Action issued in Japanese Patent Application No. 2006-548801 (with English Translation).

*Primary Examiner* — Edward J Glick
*Assistant Examiner* — Deoram Persaud
(74) *Attorney, Agent, or Firm* — Oliff & Berridge, PLC

(57) ABSTRACT

A projection optical system PL for forming an image of a first plane M on a second plane P has at least one first wedge prism 4 each of an entrance surface and an exit surface of which has a plane and in which a predetermined first wedge angle is made between the plane of the entrance surface and the plane of the exit surface, and when a coordinate system is so defined that a Z-axis direction is set along a direction of a normal to the first plane M, an X-axis direction along a direction of an intersecting line between the plane of the entrance surface and the plane of the exit surface, and a Y-axis direction along a direction perpendicular to the Z-axis direction and the X-axis direction, the first wedge prism 4 is arranged rotatably substantially around the Y-axis direction.

35 Claims, 17 Drawing Sheets

U.S. PATENT DOCUMENTS

| | | |
|---|---|---|
| 6,278,957 B1 | 8/2001 | Yasuda et al. |
| 6,583,856 B1 | 6/2003 | Takahashi |
| 6,600,550 B1 | 7/2003 | Shigematsu |
| 2002/0080338 A1 | 6/2002 | Taniguchi |
| 2003/0011755 A1 | 1/2003 | Omura et al. |
| 2004/0157143 A1 | 8/2004 | Taniguchi |

FOREIGN PATENT DOCUMENTS

| | | |
|---|---|---|
| JP | A 08-288213 | 11/1996 |
| JP | A 11-003856 | 1/1999 |
| JP | A-2000-021752 | 1/2000 |
| JP | A 2002-258487 | 9/2002 |
| WO | WO 99/36949 A | 7/1999 |

* cited by examiner

Fig.3
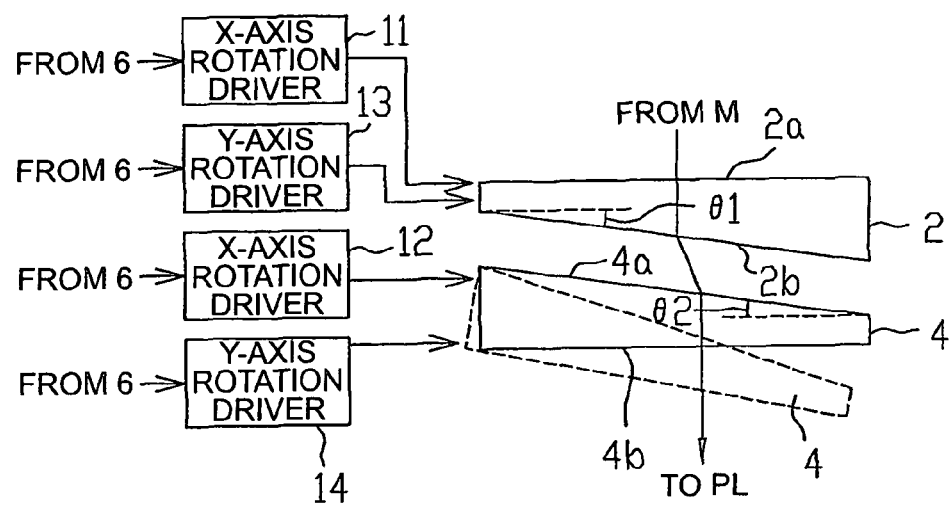
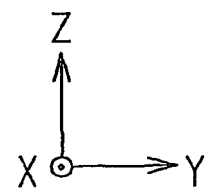

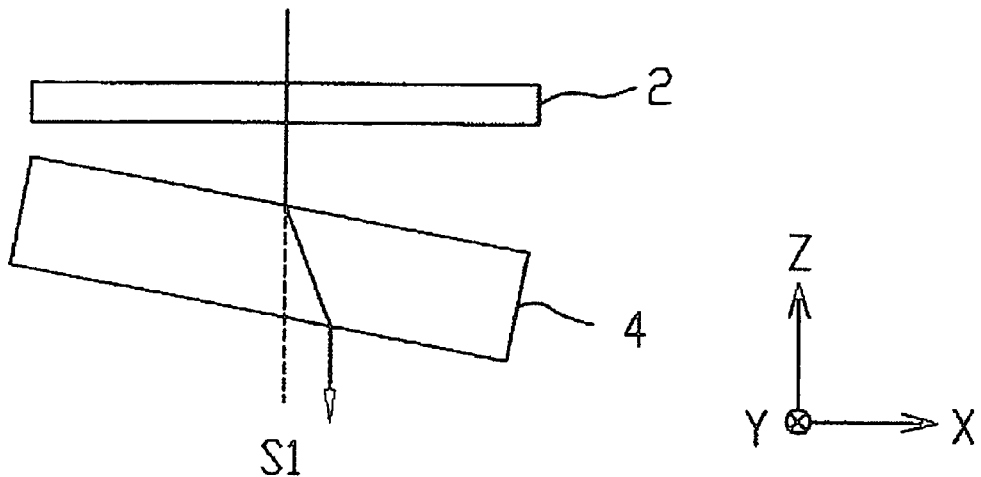
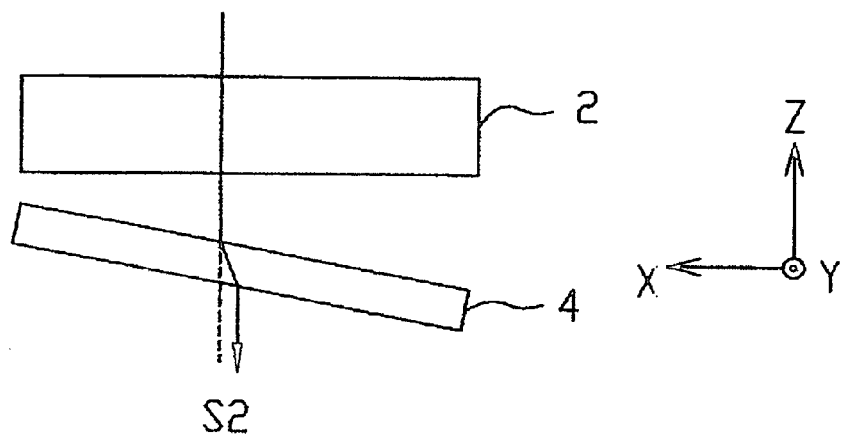

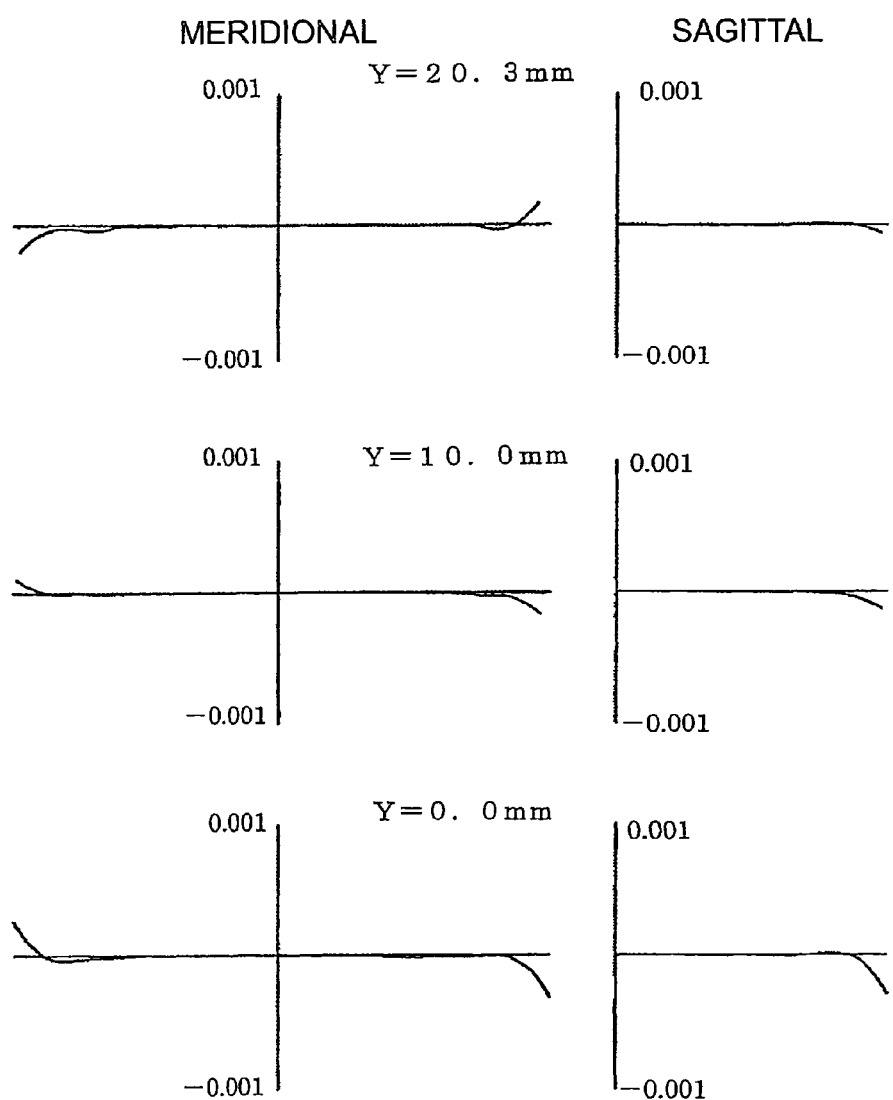

PROJECTION OPTICAL SYSTEM, EXPOSURE APPARATUS, EXPOSURE SYSTEM, AND EXPOSURE METHOD

TECHNICAL FIELD

The present invention relates to a projection optical system used in exposure apparatus for manufacturing microdevices, such as semiconductor devices and thin-film magnetic heads, and flat panel displays, such as liquid-crystal display devices, by lithography, an exposure apparatus with the projection optical system, an exposure system with the exposure apparatus, and an exposure method using the exposure apparatus.

BACKGROUND ART

A semiconductor device as one of the microdevices or a liquid-crystal display device as one of the flat panel displays is manufactured using a projection exposure apparatus for projecting a pattern of a mask (reticle, photomask, or the like) onto a substrate (glass plate, semiconductor wafer, or the like) coated with a photosensitive material such as a photoresist, through a projection optical system to effect exposure thereof.

In manufacture of the microdevices such as semiconductor devices, patterns of plural layers are formed on a substrate such as a semiconductor wafer. In this case, a scanning exposure apparatus (scanner) of the step-and-scan method is used to continuously transfer an ultrafine pattern of a mask onto the substrate with synchronous scanning of a mask stage and a substrate stage so as to form a pattern of a certain layer (e.g., lower layer) on the substrate, and a full-field exposure type projection exposure apparatus (stepper) of the step-and-repeat method is used to transfer a rather rough pattern of a mask onto the substrate on which the ultrafine pattern is formed, as overlaid thereon, to form a pattern of another layer (e.g., upper layer) on the substrate (e.g., cf. Japanese Patent Application Laid-Open No. 2001-51193 and U.S. Pat. No. 6,600,550 corresponding thereto).

DISCLOSURE OF THE INVENTION

Incidentally, when a deviation occurs between a scanning direction of the mask stage and a scanning direction of the substrate stage during the transfer of the rectangular pattern of the lower layer onto the substrate by the scanning exposure apparatus, a pattern of a parallelogram shape will be formed, instead of the pattern of the rectangular shape, on the substrate. When the upper-layer pattern of the rectangular shape is transferred over the pattern of the parallelogram shape on the substrate by the full-field exposure type projection exposure apparatus, a deviation will occur in the overlay of the patterns.

An object of the present invention is to implement high-accuracy overlay exposure of patterns.

In order to achieve the above object, a first aspect of the present invention is a projection optical system for forming an image of a first plane on a second plane, comprising: at least one first wedge prism each of an entrance surface and an exit surface of which has a plane and in which a predetermined first wedge angle is made between the plane of the entrance surface and the plane of the exit surface; wherein when a coordinate system is so defined that a Z-axis direction is set along a direction of a normal to the first plane, an X-axis direction along a direction of an intersecting line between the plane of the entrance surface and the plane of the exit surface, and a Y-axis direction along a direction perpendicular to the Z-axis direction and the X-axis direction, the first wedge prism is arranged rotatably substantially around the Y-axis direction.

A second aspect of the present invention is an exposure apparatus for performing exposure of a predetermined pattern on a photosensitive substrate, comprising: an objective optical system for forming an image of the predetermined pattern in a field region of a substantially rectangular shape, in an exposure region on the photosensitive substrate; and transforming means for transforming the image formed in the exposure region, into a parallelogram shape.

A third aspect of the present invention is an exposure apparatus for performing exposure of a predetermined pattern on a photosensitive substrate, comprising: image transforming means for transforming an image of the predetermined pattern formed on the photosensitive substrate; and rotating means for achieving a relative rotation between the image of the predetermined pattern transformed by the image transforming means, and the photosensitive substrate.

A fourth aspect of the present invention comprises projecting means for projecting a predetermined pattern disposed on the first plane, onto a photosensitive substrate, using the projection optical system of the first aspect.

A fifth aspect of the present invention is an exposure system comprising: a first exposure apparatus comprising first projecting means for forming an image of an entire first pattern region on first pattern forming means, on a photosensitive substrate, and adapted to effect full-field batch exposure of the first pattern region on the first pattern forming means into a predetermined sectional region on the photosensitive substrate; and a second exposure apparatus comprising second projecting means for forming a pattern image in a partial region of a second pattern region on second pattern forming means, on the photosensitive substrate, and adapted to effect scanning exposure of a pattern in the second pattern region on the second pattern forming means into the predetermined sectional region on the photosensitive substrate, with relative movement of the pattern image and the photosensitive substrate; wherein the first exposure apparatus comprises the exposure apparatus of the third or fourth aspect.

A sixth aspect of the present invention is an exposure method comprising an exposure step of effecting exposure of a predetermined pattern on a photosensitive substrate, using the exposure apparatus of the third or fourth aspect.

A seventh aspect of the present invention is an exposure method of effecting exposure of a predetermined pattern on a photosensitive substrate, comprising: an image transforming step of transforming an image of the predetermined pattern formed on the photosensitive substrate; and a rotating step of achieving a relative rotation between the image of the predetermined pattern transformed in the image transforming step, and the photosensitive substrate.

An eighth aspect of the present invention is an exposure method comprising: a first exposure step of effecting full-field exposure of an image of a pattern of an entire first pattern region on first pattern forming means into a predetermined sectional region on a photosensitive substrate, while keeping the first pattern forming means and the photosensitive substrate in a stationary state; and a second exposure step of effecting scanning exposure of an image of a pattern in a partial region of a second pattern region on second pattern forming means into the predetermined sectional region on the photosensitive substrate, with relative movement of the image of the pattern in the second pattern region and the photosensitive substrate; wherein the first exposure step comprises: an image transforming step of transforming the image of the pattern of the entire first pattern region formed on the photosensitive substrate; and a rotating step of effecting a relative rotation of the image of the pattern of the entire first pattern region transformed in the image transforming step, and the photosensitive substrate.

A ninth aspect of the present invention is an exposure method of effecting exposure of a predetermined pattern on a photosensitive substrate, comprising: an image forming step of forming an image of the predetermined pattern in a field region of a substantially rectangular shape, in an exposure region on the photosensitive substrate; and a transforming step of transforming the image formed in the exposure region, into a parallelogram shape.

A tenth aspect of the present invention is an exposure method comprising: a first exposure step of effecting full-field exposure of an image of a pattern of an entire first pattern region on first pattern forming means into a predetermined sectional region on a photosensitive substrate, while keeping the first pattern forming means and the photosensitive substrate in a stationary state; and a second exposure step of effecting scanning exposure of an image of a pattern in a partial region of a second pattern region on second pattern forming means into the predetermined sectional region on the photosensitive substrate, with relative movement of the image of the pattern in the second pattern region and the photosensitive substrate; wherein the predetermined sectional region is of a substantially rectangular shape, and wherein the first exposure step comprises: an image forming step of forming an image of the predetermined pattern in a field region of a substantially rectangular shape, in an exposure region on the photosensitive substrate; and a transforming step of transforming the image formed in the exposure region, into a parallelogram shape.

The projection optical system according to the first aspect of the present invention is arranged to rotate the first wedge prism around the Y-axis direction, whereby the shape of the pattern of the first plane can be changed so as to match the shape of the pattern of the lower layer formed previously on the second plane. Therefore, overlay accuracy of patterns can be improved by the extremely simple means.

The exposure apparatus according to the second aspect of the present invention enables the image of the predetermined pattern formed on the photosensitive substrate to be transformed into a parallelogram shape so as to match the shape of the pattern of the lower layer formed previously on the photosensitive substrate, whereby overlay accuracy of patterns can be improved.

The exposure apparatus according to the third aspect of the present invention enables the image of the predetermined pattern formed on the photosensitive substrate to be transformed and rotated so as to match the shape of the pattern of the lower layer formed previously on the photosensitive substrate, whereby overlay accuracy of patterns can be improved.

The exposure apparatus according to the fourth aspect of the present invention is arranged to perform the exposure, using the projection optical system arranged to rotate the first wedge prism around the Y-axis direction to enable transformation of the shape of the predetermined pattern so as to match the shape of the pattern of the lower layer formed previously on the photosensitive substrate, whereby overlay accuracy of patterns can be improved.

The exposure system according to the fifth aspect of the present invention is so arranged that the first exposure apparatus comprises the means capable of transforming and rotating the region of the predetermined pattern formed on the photosensitive substrate so as to match the region of the pattern exposed by the second exposure apparatus, whereby overlay accuracy of patterns can be improved.

The exposure methods of the present invention are arranged to transform the image of the predetermined pattern formed on the photosensitive substrate so as to match the shape of the pattern of the lower layer formed previously on the photosensitive substrate, whereby overlay accuracy of patterns can be improved and whereby good exposure can be performed.

BRIEF DESCRIPTION OF THE DRAWINGS

FIG. 3 is a drawing showing a configuration of wedge prisms according to the embodiment.

FIG. 7A is a drawing for explaining a state of rotation around the Y-axis direction of the wedge prism according to the embodiment.

FIG. 7B is a drawing for explaining a state of rotation around the Y-axis direction of the wedge prism according to the embodiment.

FIG. 17 is a transverse aberration diagram showing transverse aberrations in the meridional direction and in the sagittal direction of the projection optical system according to the example.

BEST MODES FOR CARRYING OUT THE INVENTION

Figure 1:
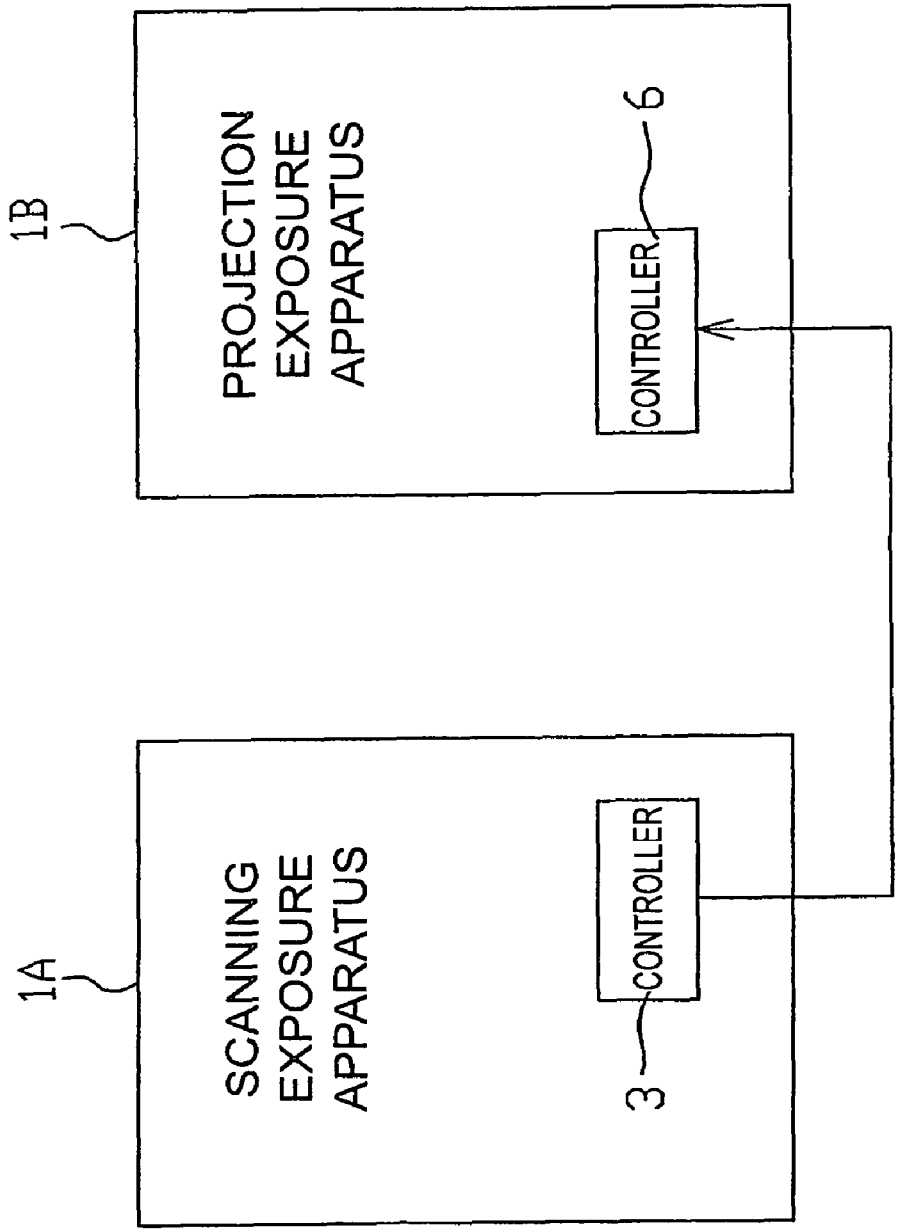
FIG. 1 is a drawing showing a schematic configuration of an exposure system according to an embodiment.

An exposure system according to an embodiment of the present invention will be described below with reference to the drawings. FIG. 1 is a drawing showing a schematic configuration of the exposure system according to the present embodiment. As shown in FIG. 1, the exposure system according to the present embodiment is provided with a scanning exposure apparatus (second exposure apparatus) 1A of the step-and-scan method and a projection exposure apparatus (first exposure apparatus) 1B of the step-and-repeat method.

The scanning exposure apparatus 1A has an illumination optical system for illuminating a mask (second pattern forming means) with a predetermined pattern (second pattern) therein, with exposure light, a projection optical system (second projecting means) for forming a pattern image of the mask illuminated by the illumination optical system, on a substrate P (cf. FIG. 2), e.g., such as a semiconductor wafer coated with a photosensitive material, and so on, which are not shown. The projection optical system forms a pattern image in a partial region of a region (second pattern region) of the pattern formed on the mask, in a predetermined sectional region on the substrate P. The scanning exposure apparatus (scanner) 1A performs scanning exposure of the pattern of the mask in a predetermined region on the substrate P through the projection optical system, with relative movement of a mask stage carrying the mask (i.e., the pattern image of the mask) and a substrate stage carrying the substrate P (i.e., the substrate P).

The positions of the mask stage and the substrate stage are measured by a mask-side laser interferometer and by a substrate-side laser interferometer, respectively, and are controlled based on the measurement result. The scanning exposure apparatus 1A is provided with a controller 3 for controlling the scanning exposure of the scanning exposure apparatus 1A. The mask-side laser interferometer for measuring positions of the mask stage in a scanning direction and in a direction perpendicular to the scanning direction (which will be referred to hereinafter as a non-scanning direction) is connected to the controller 3, and the mask-side laser interferometer outputs the measured positions of the mask stage in the scanning direction and in the non-scanning direction to the controller 3. The substrate-side laser interferometer for measuring positions of the substrate stage in the scanning direction and in the non-scanning direction is connected to the controller 3, and the substrate-side laser interferometer outputs the measured positions of the substrate stage in the scanning direction and in the non-scanning direction to the controller 3.

Figure 2:
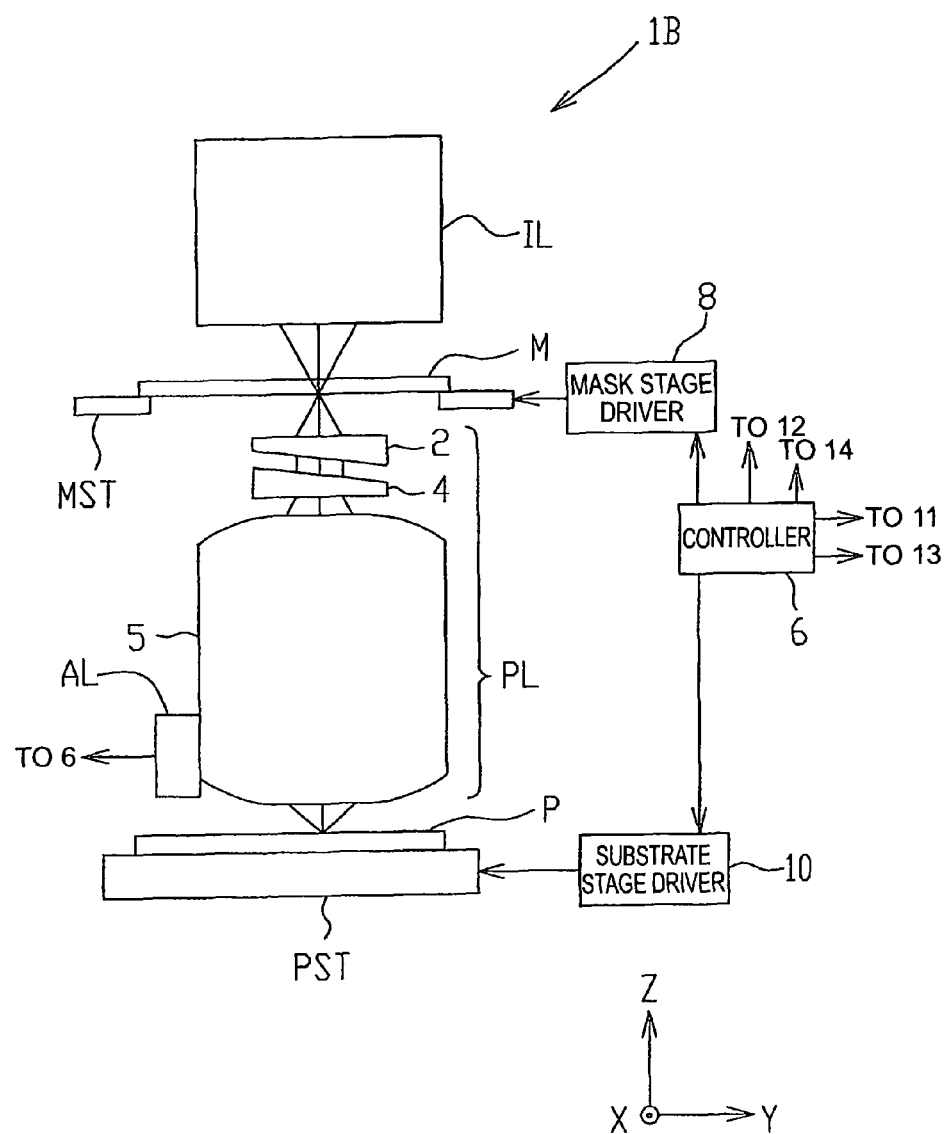
FIG. 2 is a drawing showing a schematic configuration of a projection exposure apparatus according to the embodiment.

FIG. 2 is a drawing showing a schematic configuration of the projection exposure apparatus 1B shown in FIG. 1. As shown in FIG. 2, the projection exposure apparatus 1B has an illumination optical system IL for illuminating a mask (first pattern forming means) M with a predetermined pattern (first pattern) therein, with exposure light emitted from an unrepresented light source, and a projection optical system (first projecting means) PL for forming a pattern image of the mask M illuminated by the illumination optical system IL, on the substrate P. The projection optical system PL forms an image of an entire pattern region (first pattern region) on the mask M, in a predetermined sectional region on the substrate P. The projection exposure apparatus (stepper) 1B implements full-field batch exposure of the pattern of the mask (first plane) M mounted on a mask stage MST, in a predetermined region on a plate (second plane or photosensitive substrate) P mounted on a substrate stage PST, through the projection optical system PL. Namely, the projection exposure apparatus 1B projects the pattern (predetermined pattern) of the mask M onto the substrate P to effect exposure thereof, while the substrate P is kept in a stationary state. In the description hereinafter, the Z-axis direction is set along a direction of a normal to the plane of the mask M, the X-axis direction along a direction of an intersecting line between entrance surface 4a and exit surface 4b of wedge prism 4 described later, and the Y-axis direction along a direction perpendicular to the Z-axis and the X-axis directions.

The illumination optical system IL has an unrepresented light source, and the light source to be used is, for example, a mercury lamp for supplying exposure light of the g-line (436 nm), h-line (405 nm), and i-line (365 nm) which are wavelengths necessary for exposure. A beam emitted from the light source travels through an unrepresented light guide, an unrepresented optical integrator for converting the beam from the light guide into a beam with a uniform illuminance distribution, an unrepresented blind section having an aperture for shaping beams from the optical integrator into a rectangular shape (oblong), an unrepresented condenser lens for focusing a beam having passed through the blind section, on the mask M, and so on, to illuminate a rectangular illumination region on the mask M.

The mask stage MST carrying the mask M is arranged movably in the X-axis direction and in the Y-axis direction and rotatably around the Z-axis direction. A beam having passed through the pattern formed on the mask M travels through wedge prism (first wedge prism) 2 and wedge prism (second wedge prism) 4 in the projection optical system PL. In this embodiment, as shown in FIG. 2, the wedge prisms 2, 4 are located nearest to the mask M in a substantially telecentric optical path of the projection optical system PL. FIG. 3 is a drawing showing a configuration of the wedge prisms 2, 4. As shown in FIG. 3, entrance surface 2a and exit surface 2b of the wedge prism 2 have their respective planes, and a wedge angle (predetermined second wedge angle) $\theta 1$ is made between the plane of the entrance surface 2a and the exit surface 2b.

In the present embodiment the wedge prism 2 is arranged so that a direction of an intersecting line between the plane of the entrance surface 2a and the plane of the exit surface 2b extends along the X-axis direction. The wedge prism 2 is arranged rotatably substantially around the X-axis direction by driving of an X-axis rotation driving section 11 described later and rotatably substantially around the Y-axis direction by driving of a Y-axis rotation driving section 13 described later.

The entrance surface 4a and exit surface 4b of the wedge prism 4 have their respective planes and a wedge angle (predetermined first wedge angle) $\theta 2$ approximately equal to the wedge angle $\theta 1$ is made between the plane of the entrance surface 4a and the exit surface 4b. In the present embodiment, the wedge prism 4 is so arranged that a direction of an intersecting line between the plane of the entrance surface 4a and the plane of the exit surface 4b extends along the X-axis direction and that directions of the wedge angle $\theta 1$ of the wedge prism 2 and the wedge angle $\theta 2$ of the wedge prism 4 are substantially opposite to each other. The wedge prism 4 is arranged rotatably substantially around the X-axis direction by driving of an X-axis rotation driving section 12 described later and rotatably substantially around the Y-axis direction by driving of a Y-axis rotation driving section 14 described later. A dashed part in FIG. 3 shows an example of an arrangement state of the wedge prism 4 after rotation of the wedge prism 4 substantially around the X-axis direction.

The projection magnification of the projection optical system PL in the Y-axis direction can be adjusted by rotating at least one of the wedge prism 2 and the wedge prism 4 around the X-axis direction. The projection position can be shifted in the X-axis direction and in the Y-axis direction of the projection optical system PL by rotating at least one of the wedge prism 2 and the wedge prism 4 around the Y-axis direction. Namely, the pattern image of the mask M formed on the substrate P can be transformed asymmetrically in the plane (plane of substrate P) perpendicular to the optical axis (Z-axis) of the projection optical system PL (image transforming means).

A beam emerging from the wedge prism 4 travels through a projection lens unit 5 as an objective optical system in the projection optical system PL to reach a projection region (first pattern region) on the substrate P to form a reduced image of the entire pattern of the mask M on the substrate P (projecting means). At this time, the pattern of the mask M imaged on the substrate P is of a rectangular shape, the longitudinal direction of which is parallel to the aforementioned X-axis direction and the transverse direction of which is parallel to the aforementioned Y-axis direction. The substrate stage PST carrying the substrate P is arranged movably in the X-axis direction and in the Y-axis direction and rotatably around the Z-axis direction. The substrate stage PST can be rotated around the Z-axis direction to implement a relative rotation between the pattern image of the mask M and the substrate P (rotating means). Instead of the rotation of the substrate stage PST around the Z-axis, the mask stage MST may be rotated around the Z-axis direction, or the substrate stage PST and the mask stage MST both may be rotated around the Z-axis.

As shown in FIG. 3, the X-axis rotation driving section 11 is connected to the controller 6, and the X-axis rotation driving section 11 rotates the wedge prism 2 around the X-axis direction on the basis of a control signal from the controller 6. The Y-axis rotation driving section 13 is connected to the controller 6 and the Y-axis rotation driving section 13 rotates the wedge prism 2 around the Y-axis direction on the basis of a control signal from the controller 6.

As shown in FIG. 3, the X-axis rotation driving section 12 is connected to the controller 6 and the X-axis rotation driving section 12 rotates the wedge prism 4 around the X-axis direction on the basis of a control signal from the controller 6. The Y-axis rotation driving section 14 is connected to the controller 6 and the Y-axis rotation driving section 14 rotates the wedge prism 4 around the Y-axis direction on the basis of a control signal from the controller 6.

As shown in FIG. 2, a mask stage driving section 8 is connected to the controller 6 and the mask stage driving section 8 moves the mask stage MST in the X-axis direction or in the Y-axis direction or rotates the mask stage MST around the Z-axis direction on the basis of a control signal from the controller 6. Furthermore, a substrate stage driving section 10 is connected to the controller 6 and the substrate stage driving section 10 moves the substrate stage PST in the X-axis direction or in the Y-axis direction or rotates the substrate stage PST around the Z-axis direction on the basis of a control signal from the controller 6.

An alignment detection system AL of the off-axis method is attached to a side face of a barrel of the projection optical system PL, and the controller 6 detects positions of alignment marks provided on the substrate P, based on information from this alignment detection system AL and measured values by the substrate-side laser interferometer. Then the controller 6 calculates a shape (region) of a pattern (pattern of a lower layer) having been formed by scanning exposure in the scanning exposure apparatus 1A, from the detected positions of the alignment marks.

For example, let us consider a case wherein a pattern of a second layer is transferred onto substrates in one lot, as an example. The precondition is that a plurality of shot areas (second pattern regions) into which, for example, a pattern of a first layer including alignment marks has already been transferred, are already formed on each substrate P, using the scanning exposure apparatus 1A. It is assumed in this embodiment that a plurality of (preferably, four each) two-dimensional marks permitting simultaneous detection of positions in the X-axis direction and in the Y-axis direction are formed for each shot area (second pattern region), as the alignment marks.

Then the positions of all the alignment marks provided for each shot area on the first substrate of the lot are detected using the alignment detection system AL and the substrate-side laser interferometer. The controller 6 performs the operation of so-called in-shot multi-point EGA (enhanced global alignment), based on the information of the detected positions of the respective alignment marks, to obtain scaling factors in the XY directions of the substrate P (linear expansion and contraction of substrate P), a rotational error of the substrate P, offsets in the XY directions of the substrate P, an orthogonality error of the stage coordinate system, scaling factors in the XY directions of the shot area (linear expansion and contraction of the shot area), a rotational error of the shot area, and an orthogonality error of the shot area. Such an in-shot multi-point EGA system is disclosed, for example, in Japanese Patent Application Laid-Open No. 2003-59809. The orthogonality error of the shot area determined herein by the in-shot multi-point EGA system corresponds to the aforementioned shape (region) of the pattern having been formed by the scanning exposure (the pattern of the first layer).

The controller 6 calculates the shape (region) of the pattern having been formed by the scanning exposure (the pattern of the lower layer) in the scanning exposure apparatus 1A, based on the position information of the mask stage and the substrate stage measured by the mask-side laser interferometer and the substrate-side laser interferometer in the scanning exposure apparatus 1A and fed from the controller 3 of the scanning exposure apparatus 1A.

The controller 6 calculates an amount of rotation of the wedge prism 4 around the Y-axis direction, based on the calculated shape of the pattern having been formed by the scanning exposure in the scanning exposure apparatus 1A. Then the controller 6 outputs a control signal based on the calculated rotation amount to the Y-axis rotation driving section 14 to actuate the Y-axis rotation driving section 14 to rotate the wedge prism 4 around the Y-axis direction.

The controller 6 also calculates an amount of rotation of the mask stage MST or the substrate stage PST around the Z-axis direction, based on the rotation amount of the wedge prism 4 around the Y-axis direction. The controller 6 outputs a control signal based on the calculated rotation amount to the mask stage driving section 8 or to the substrate stage driving section 10 to actuate the mask stage driving section 8 or the substrate stage driving section 10 to rotate the mask stage MST (mask M) or the substrate stage PST (substrate P) around the Z-axis direction.

The controller 6 also calculates an amount of rotation of the wedge prism 2 or the wedge prism 4 around the X-axis direction for correction for the magnification in the Y-axis direction of the projection region varying with expansion or contraction or the like due to heat of the substrate P and outputs a control signal based on the calculated rotation amount to the X-axis rotation driving section 11 or to the X-axis rotation driving section 12 to actuate the X-axis rotation driving section 11 or the X-axis rotation driving section 12 to rotate the wedge prism 2 or the wedge prism 4 around the X-axis direction, thereby correcting the magnification in the Y-axis direction of the projection region as well.

The following will describe a method of correcting an overlay error between patterns formed on the substrate P, using the exposure system according to the present embodiment. Namely, let us describe a method of correcting an overlay error between a fine pattern (the pattern of the lower layer) formed by scanning exposure on the substrate P by the scanning exposure apparatus 1A, and a rather rough pattern (pattern of the upper layer) formed by full-field exposure on the substrate P by the projection exposure apparatus 1B.

Figure 4:
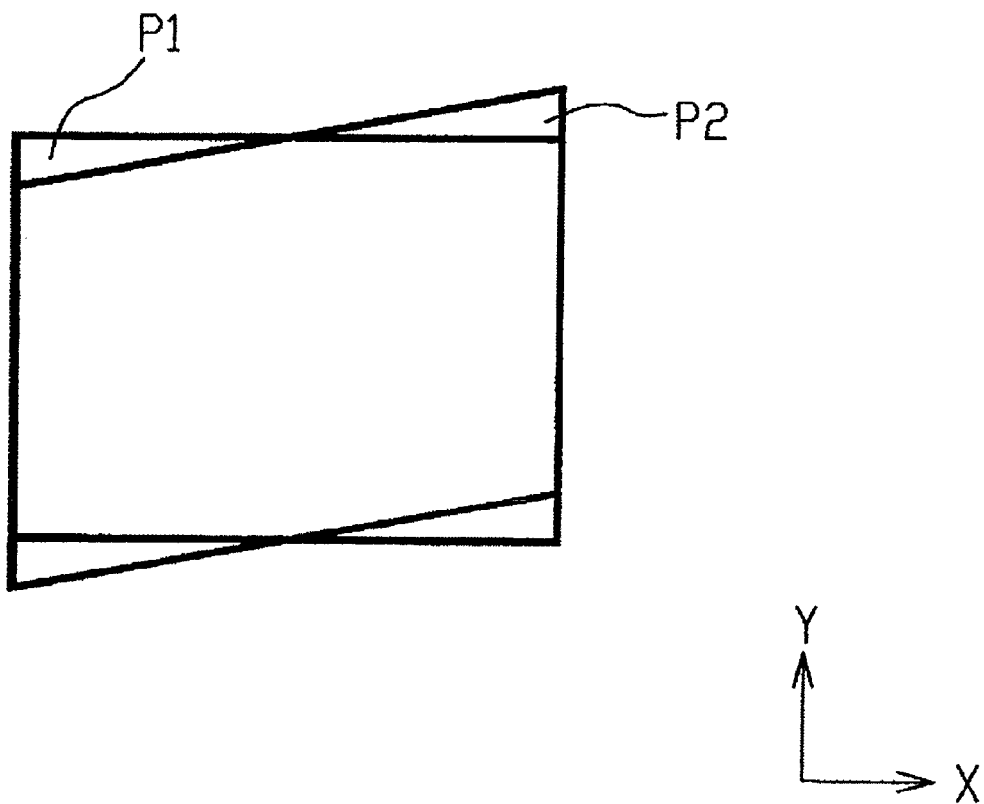
FIG. 4 is a drawing for explaining a pattern shape of a lower layer formed on a plate.

First, the scanning exposure apparatus 1A performs scanning exposure of the pattern of the lower layer on the substrate P (second exposure step). For example, when a deviation occurs between the scanning direction of the mask stage and the scanning direction of the substrate stage in the scanning exposure apparatus 1A, a pattern P2 of a parallelogram shape, instead of a pattern P1 of a rectangular shape (oblong), is formed on the substrate P, as shown in FIG. 4. When a pattern of a rectangular shape (oblong) of the mask M being the pattern of the upper layer is transferred as overlaid on the substrate P in which the pattern P2 of the parallelogram shape has been formed, by the projection exposure apparatus 1B, a deviation occurs in the overlay of patterns. Therefore, it is necessary to transform the pattern of the mask M so as to match the shape (region) of the pattern P2 of the parallelogram shape.

Figure 5:
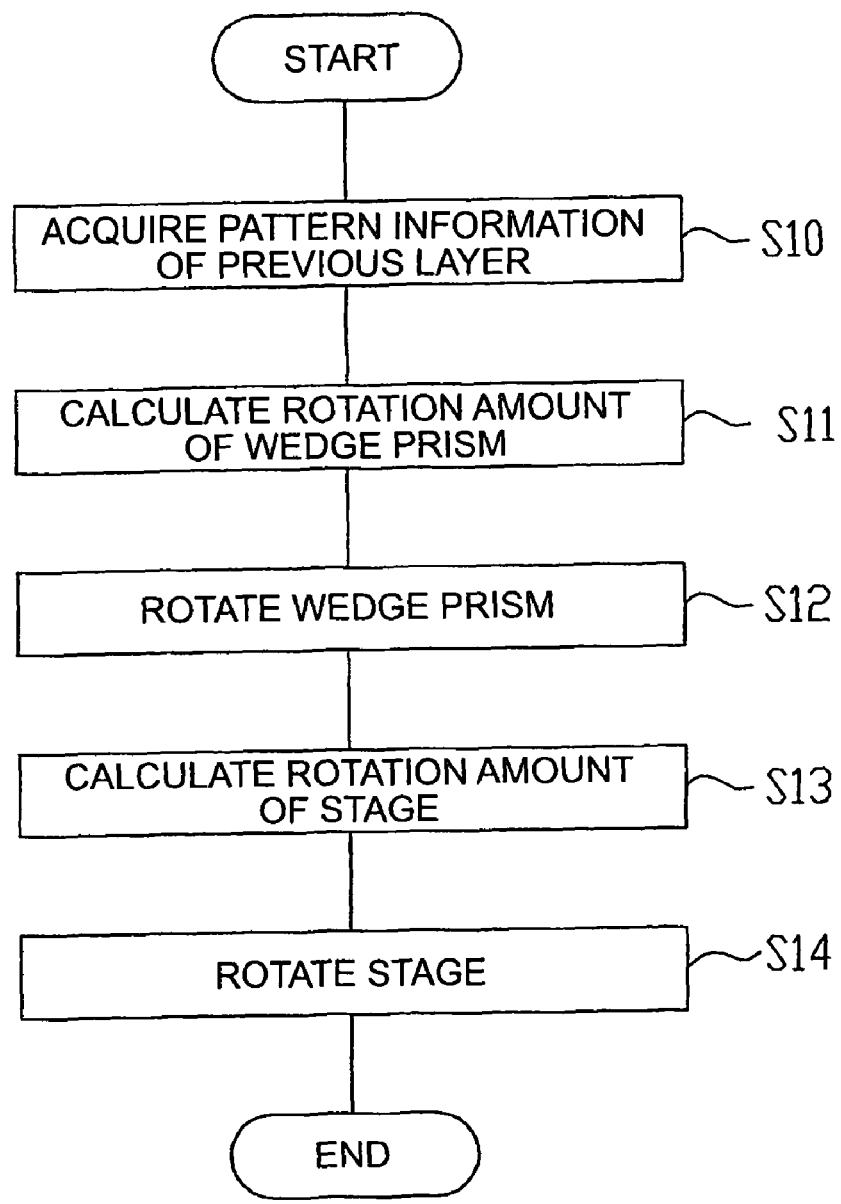
FIG. 5 is a flowchart for explaining a method of correcting an overlay error of patterns, using the projection exposure apparatus according to the embodiment.

FIG. 5 is a flowchart for explaining a correction method of an overlay error according to the present embodiment. First, the controller 6 detects the positions of the alignment marks on the substrate P with the exposed pattern of the first layer, and obtains an orthogonality error (the pattern shape of the lower (first) layer) of each shot area (second pattern region) on the basis of the result of the detection (step S10).

Next, the controller 6 calculates a rotation amount of the wedge prism 4 around the Y-axis direction, based on the calculated shape of the pattern of the lower layer (step S11). The controller 6 outputs a control signal based on the rotation amount of the wedge prism 4 calculated in step S11, to the Y-axis rotation driving section 14 to actuate the Y-axis rotation driving section 14 to rotate the wedge prism 4 around the Y-axis direction (step S12). Namely, it transforms the pattern image of the mask M formed on the substrate P (image transforming step).

Figure 6A:
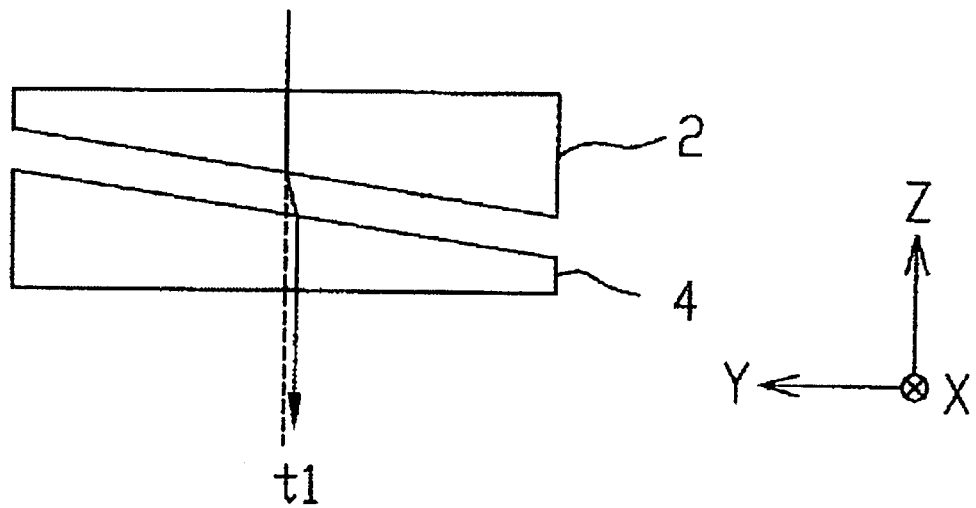
FIG. 6A is a drawing for explaining a state of rotation around the Y-axis direction of the wedge prism according to the embodiment.
Figure 6B:
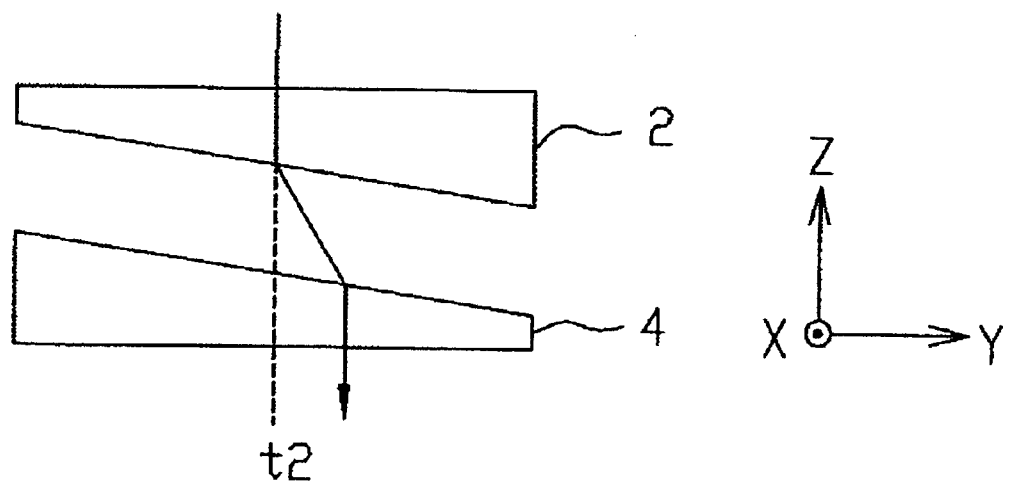
FIG. 6B is a drawing for explaining a state of rotation around the Y-axis direction of the wedge prism according to the embodiment.

When the wedge prism 4 is rotated around the Y-axis direction, the projection position in the Y-axis direction of the projection optical system PL is shifted. FIG. 6A is a drawing showing the positions of the wedge prisms 2, 4 viewed from the −X-direction side, in a case where the wedge prism 4 has been rotated by a small amount clockwise around the Y-axis direction, and FIG. 6B a drawing showing the positions of the wedge prisms 2, 4 viewed from the +X-direction side, in the case where the wedge prism 4 has been rotated by the small amount clockwise around the Y-axis direction. The exposure light passing through the outermost region on the −X-direction side is shifted by t1 in the Y-axis direction as shown in FIG. 6A, and the exposure light passing through the outermost region on the +X-direction side is shifted by t2 in the Y-axis direction as shown in FIG. 6B.

When the wedge prism 4 is rotated around the Y-axis direction, the projection position in the X-axis direction of the projection optical system PL is also shifted. FIG. 7A shows the positions of the wedge prisms 2, 4 viewed from the −Y-direction side, in the case where the wedge prism 4 has been rotated by the small amount clockwise around the Y-axis direction, and FIG. 7B a drawing showing the positions of the wedge prisms 2, 4 viewed from the +Y-direction side, in the case where the wedge prism 4 has been rotated by the small amount clockwise around the Y-axis direction. The exposure light passing through the outermost region on the −Y-direction side is shifted by s1 in the X-axis direction as shown in FIG. 7A, and the exposure light passing through the outermost region on the +Y-direction side is shifted by s2 in the X-axis direction as shown in FIG. 7B.

Figure 8:
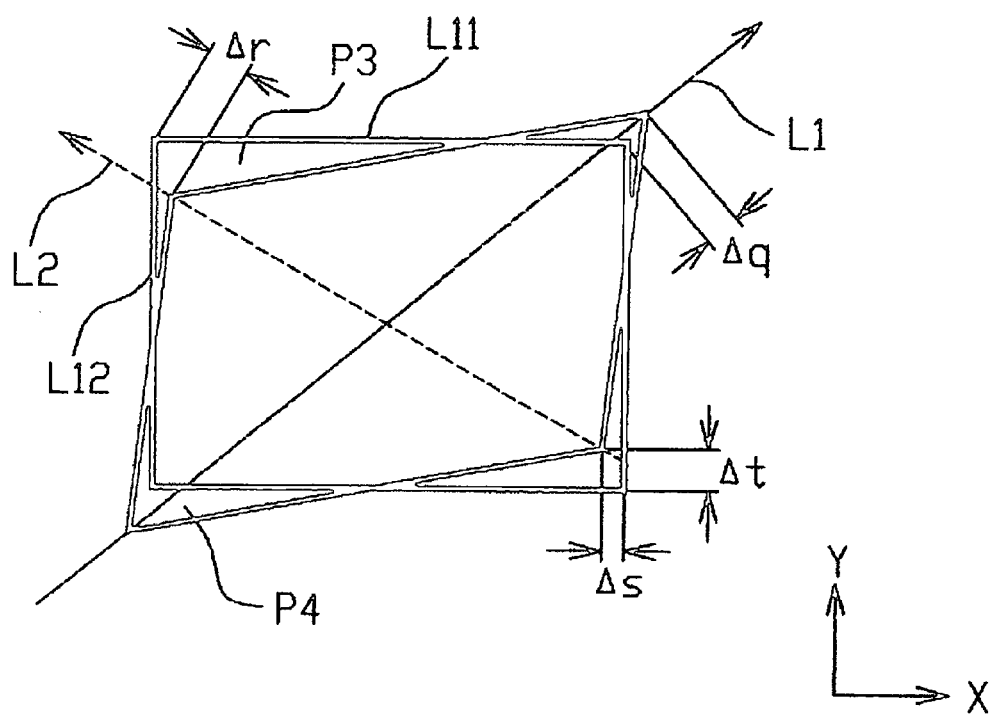
FIG. 8 is a drawing for explaining a pattern shape with rotation around the Y-axis direction of the wedge prism according to the embodiment.

Namely, as shown in FIG. 8, when a pattern P3 of the mask M formed on the substrate P without rotation of the wedge prism 4 is of a rectangular shape (oblong), a pattern P4 of the mask M formed on the substrate P with the clockwise small-amount rotation of the wedge prism 4 around the Y-axis direction is of a parallelogram shape. As shown in FIG. 8, a direction (first direction) L1 parallel to a diagonal of the parallelogram of the pattern P4 is a direction different from sides L11, L12 of the rectangular shape of the pattern P3, and a transformation amount $\Delta q$ in the direction of the first direction L1 is different from a transformation amount $\Delta r$ in a direction (second direction intersecting with the first direction) L2 parallel to the other diagonal of the parallelogram of the pattern P4.

Next, the controller 6 calculates a rotation amount of the pattern of the mask M formed on the substrate P, i.e., a rotation amount around the Z-axis direction of the mask stage MST or the substrate stage PST, based on the rotation amount around the Y-axis direction of the wedge prism 4 rotated in step S12 (step S13).

Namely, when the pattern P3 of the mask M formed on the substrate P without rotation of the wedge prism 4 is of the rectangular shape (oblong), as shown in FIG. 8, the pattern P4 of the mask M formed on the substrate P with the clockwise small-amount rotation of the wedge prism 4 around the Y-axis direction is of the parallelogram shape and there is a deviation in position in the direction of rotation around the Z-axis direction from the pattern P2 of the previous layer shown in FIG. 4. In FIG. 8 $\Delta t$ is a transformation amount in the Y-axis direction and absolute value ($|t1-t2|$) of a difference between t1 and t2 shown in FIG. 6, and $\Delta s$ is a transformation amount in the X-axis direction and absolute value ($|s1-s2|$) of a difference between s1 and s2 shown in FIG. 7.

Figure 9A:
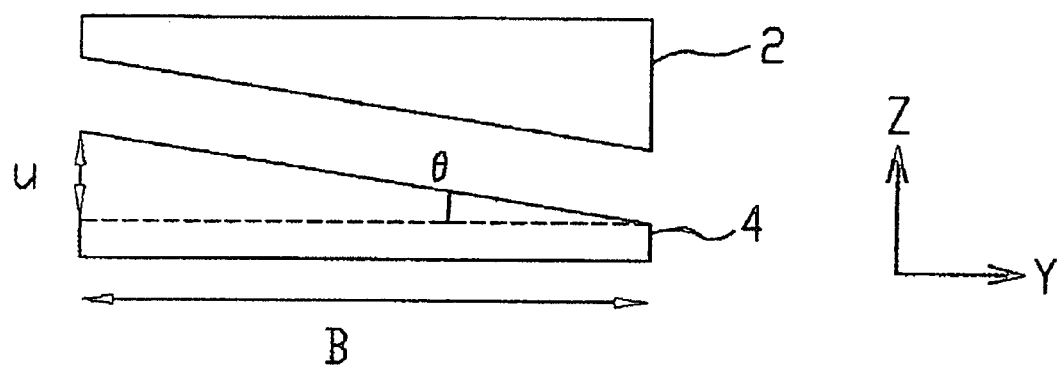
FIG. 9A is a drawing for explaining a state of rotation around the Y-axis direction of the wedge prism according to the embodiment.
Figure 9B:
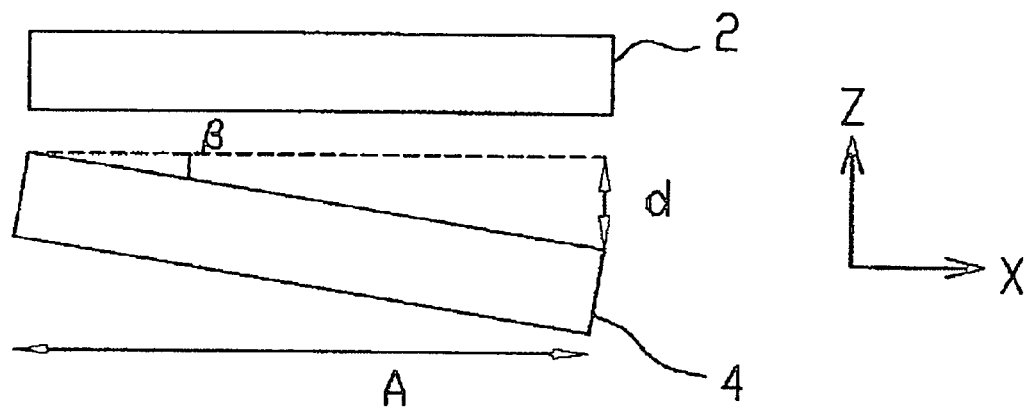
FIG. 9B is a drawing for explaining a state of rotation around the Y-axis direction of the wedge prism according to the embodiment.

Now, as shown in FIGS. 9A and 9B, let $\theta$ be the magnitude of the wedge angle $\theta 2$ of the wedge prism 4, $\beta$ be the magnitude of the angle of rotation around the Y-axis, A (longitudinal direction) be the X-directional length of the rectangular shape P1 shown in FIG. 4, and B (transverse direction) be the Y-directional length of the rectangular shape P1. Then a difference d of thickness (thickness of the gas layer) between the wedge prism 2 and the wedge prism 4 with the small-amount rotation around the Y-axis direction of the wedge prism 4, and a difference u of thickness of the wedge prism 4 due to the wedge angle are given as follows.

$$d = A \tan \beta$$

$$u = B \tan \theta$$

When the refractive index of the glass material forming the wedge prisms 2, 4 is represented by n, the absolute value $\Delta t$ of the difference between t1 and t2 and the absolute value $\Delta s$ of the difference between s1 and s2 are expressed as follows.

$$\Delta t = (n-1) d \sin \theta$$

$$\Delta s = (n-1/n) u \sin \beta$$

Assuming that the wedge angle $\theta$ and the Y-axis rotation angle $\beta$ are sufficiently small, the following relation holds:

$$\Delta t / \Delta s = n(A/B).$$

Based on this ratio of the absolute value $\Delta t$ of the difference between t1 and t2 and the absolute value $\Delta s$ of the difference between s1 and s2, the controller 6 calculates a rotation amount of the pattern of the mask M formed on the substrate P, i.e., a rotation amount around the Z-axis direction of the mask stage MST or the substrate stage PST.

Next, the controller 6 outputs a control signal based on the rotation amount calculated in the step S13, to the mask stage driving section 8 or to the substrate stage driving section 10 to actuate the mask stage driving section 8 or the substrate stage driving section 10 to rotate the mask stage MST (mask M) or the substrate stage PST (substrate P) around the Z-axis direction (step S14).

When in the step S14 the mask stage MST or the substrate stage PST is rotated around the Z-axis direction, the pattern image of the mask M is rotated relative to the substrate P (rotating step), whereby the pattern P4 of the mask M formed on the substrate P shown in FIG. 8 becomes approximately coincident with the pattern P2 of the previous layer shown in FIG. 4. As described above, the projection exposure apparatus 1B transforms the pattern of the mask M so as to match the pattern shape having been formed by scanning exposure by the scanning exposure apparatus 1A, and then performs exposure on the substrate P (first exposure step).

Since the exposure system (projection exposure apparatus) according to the present embodiment is able to rotate the wedge prism 4 around the Y-axis direction, the shape of the pattern of the mask M (e.g., an oblong) can be transformed so as to match the shape of the pattern of the lower layer (e.g., a parallelogram) already formed on the substrate P. Namely, the pattern of the rectangular shape of the mask M can be transformed into the pattern of the parallelogram shape. Therefore, the overlay accuracy of patterns can be improved by use of the existing wedge prisms for adjustment of magnification of the projection region. Since the wedge prism is arranged rotatably clockwise and counterclockwise around the Y-axis direction, it is able to deal with deviations in the both scanning directions of the + direction and − direction occurring during exposure of the pattern of the lower layer. The exposure system (projection exposure apparatus) of the present embodiment is also able to match a predetermined direction with an immediately lower layer (previous layer) out of a plurality of lower layers already formed on the substrate P, and to match a direction approximately perpendicular to the predetermined direction, with a second lower layer (second previous layer) from the current layer.

The projection exposure apparatus of the present embodiment is arranged to transform the pattern image of the mask M formed on the substrate P by rotating the wedge prism 4 around the Y-axis direction, but the projection exposure apparatus may also be arranged to transform the pattern image of the mask M formed on the substrate P by rotating the wedge prism 2 around the Y-axis direction. The projection exposure apparatus may also be arranged to transform the pattern image of the mask M formed on the substrate P by rotating the wedge prism 2 and the wedge prism 4 around the Y-axis direction.

The projection exposure apparatus of the present embodiment is arranged so that the wedge prism 2 and the wedge prism 4 are rotatable around the X-axis direction and around the Y-axis direction, but the projection exposure apparatus may be arranged so that either the wedge prism 2 or the wedge prism 4 is rotatable around the X-axis direction and around the Y-axis direction. The projection exposure apparatus may also be so arranged that the wedge prism 2 is rotatable around the X-axis direction or around the Y-axis direction and that the wedge prism 4 is rotatable around the Y-axis direction or around the X-axis direction. The projection exposure apparatus may also be so arranged that the wedge prism 2 is rotatable around the X-axis direction and around the Y-axis direction and that the wedge prism 4 is rotatable around the X-axis direction or around the Y-axis direction, or may be so arranged that the wedge prism 2 is rotatable around the X-axis direction or around the Y-axis direction and that the wedge prism 4 is rotatable around the X-axis direction and around the Y-axis direction.

The projection exposure apparatus of the present embodiment is provided with the two wedge prisms 2, 4, but a necessary condition is that the projection exposure apparatus is provided with at least one wedge prism.

In the projection exposure apparatus of the present embodiment the wedge prisms 2, 4 are located nearest to the surface of the mask M in the substantially telecentric optical path of the projection optical system PL, but any other optical member may be interposed between the mask M and the wedge prisms 2, 4 or between the wedge prisms 2, 4 as long as the wedge prisms 2, 4 are located in the substantially telecentric optical path of the projection optical system PL and on the surface side of the mask M.

The projection exposure apparatus of the present embodiment is arranged to rotate the pattern image formed on the plate, by rotating the mask stage or the substrate stage around the Z-axis direction, but the projection exposure apparatus may be so arranged that the projection optical system is provided with an image rotating mechanism and that the pattern image formed on the plate is rotated by means of the image rotating mechanism.

This image rotating mechanism applicable herein is, for example, a trapezoid prism (Dove prism), an image rotator consisting of three mirrors, or the like. When the projection optical system is, for example, the one disclosed in Japanese Patent No. 3666606 and U.S. Pat. No. 5,614,988 corresponding thereto, the one disclosed in International Publication WO99/45580 and U.S. Pat. No. 6,583,856 corresponding thereto, or the one disclosed in International Publication WO01/65296 and Published U.S. Pat. Application No. 2003/0011755 corresponding thereto, the pattern image formed on the plate can be rotated by rotating a path folding mirror, for example, around a direction of a normal to the mask surface or around a direction of a normal to the substrate surface.

Figure 10:
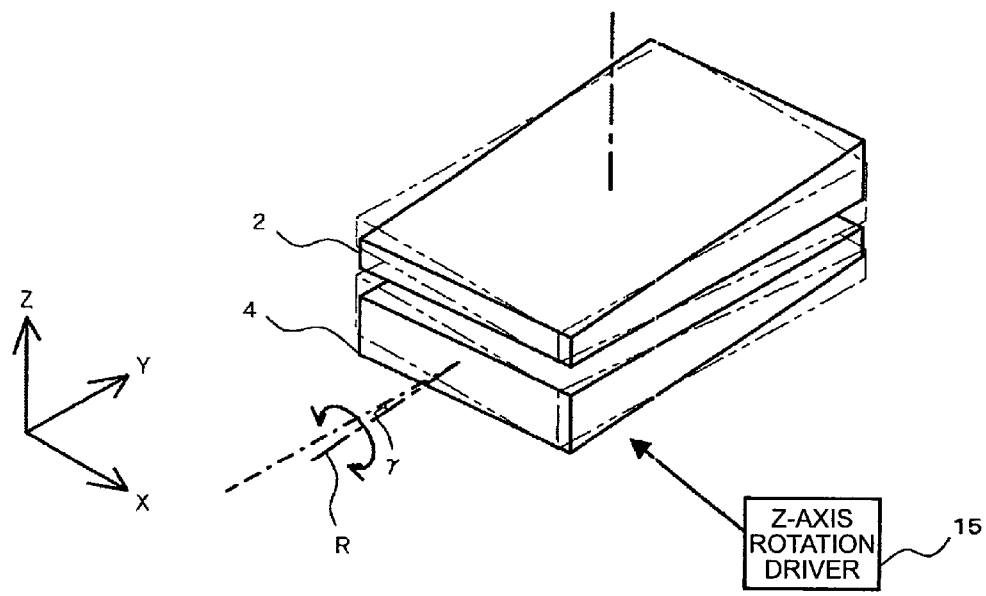
FIG. 10 is a drawing showing a configuration of wedge prisms according to a modification example of the embodiment.

In the aforementioned embodiment, the apparatus may be provided with a Z-axis rotation driving section 15 for rotating the first wedge prism 2 and the second wedge prism 4 around the Z-axis as shown in FIG. 10. When the wedge prism 2 is rotated by the Y-axis rotation driving section 13 after rotation of the first wedge prism 2 and the second wedge prism 4 around the Z-axis, the wedge prism 2 is rotated around a rotation axis R resulting from rotation by a predetermined angle γ from the Y-axis in the XY plane. In FIG. 10, for easier understanding, the state of the wedge prisms 2, 4 before the rotation operation is indicated by chain double-dashed lines. This configuration enables the pattern of the rectangular shape of the mask M to be transformed into the pattern of the parallelogram shape, without rotation of the mask stage or the substrate stage around the Z-axis direction. The rotation operation of the wedge prisms 2, 4 around the Z-axis may be combined with the rotation operation of the mask stage or the substrate stage around the Z-axis.

Figure 11:
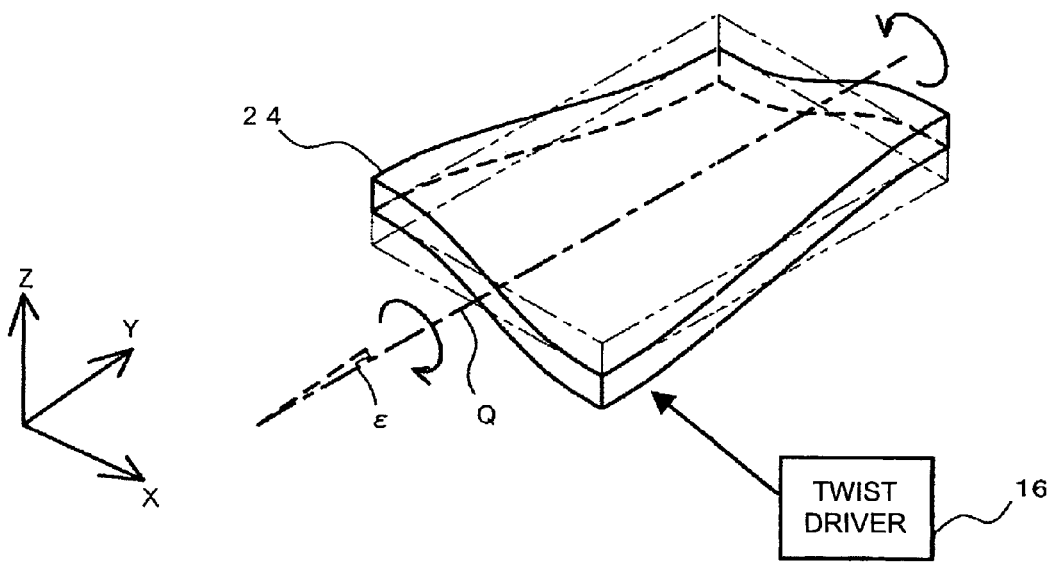
FIG. 11 is a drawing showing a configuration of a transforming means (image transforming means) according to a modification example of the embodiment.

The first wedge prism 2 and the second wedge prism 4 in the foregoing embodiment may be replaced with a plane-parallel plate 24 in the XY plane and a twist driving section 16, as shown in FIG. 11, and the twist driving section 16 is used to transform the plane-parallel plate 24 so as to twist it around a rotation axis Q (twist axis Q) resulting from rotation by a predetermined angle ε from the Y-axis in the XY plane. In FIG. 11, for easier understanding, the state of the plane-parallel plate 24 before the twist operation is indicated by chain double-dashed lines. This configuration permits the pattern of the rectangular shape of the mask M to be transformed into the pattern of the parallelogram shape, without rotation of the mask stage or the substrate stage around the Z-axis direction. When the twist axis Q is set in parallel with the X-axis or the Y-axis, the twist transformation operation of the plane-parallel plate 24 is effected in combination with rotation of the mask stage or the substrate stage around the Z-axis direction.

A pair of toric lenses arranged so that a relative rotation angle thereof around the Z-axis can be controlled, may be provided instead of the first wedge prism 2 and the second wedge prism 4. In this connection, the toric lens pair may be provided in the projection lens unit 5.

The exposure system of the present embodiment is provided with the scanning exposure apparatus and the projection exposure apparatus for performing the exposure of the pattern formed in the mask, on the plate, but the exposure system may be provided with the scanning exposure apparatus or the projection exposure apparatus for performing exposure of a pattern formed by a pattern generator, on a plate.

The exposure system of the present embodiment was arranged to obtain the pattern shape transferred by the scanning projection exposure apparatus 1A, using the alignment detection system AL of the full-field exposure type projection exposure apparatus 1B, but the exposure system may be arranged to acquire the position information of the mask stage and the substrate stage from the scanning projection exposure apparatus 1A and to calculate the pattern shape transferred by the scanning projection exposure apparatus 1A, based on this position information. At this time, the controller 6 of the full-field exposure type projection exposure apparatus 1B acquires time-series position information of the mask stage and the substrate stage fed from the controller 3 of the scanning projection exposure apparatus 1A as measured by the mask-side laser interferometer and the substrate-side laser interferometer in the scanning projection exposure apparatus 1A, determines how the mask stage and the substrate stage were moved, and, therefore, how the mask and the substrate are moved, based on the foregoing information, and calculates the shape (region) of the pattern (pattern of the first layer) having been formed by the scanning exposure by the scanning projection exposure apparatus 1A.

The exposure system of the foregoing embodiment can be used to manufacture microdevices (semiconductor devices, image pickup devices, liquid-crystal display devices, thin-film magnetic heads, etc.) by illuminating a reticle (mask) by the illumination optical system IL and to project a pattern to be transferred, formed in the mask, onto a photosensitive substrate (wafer) through a projection optical system PL to effect exposure thereof. An example of a technique of manufacturing semiconductor devices as microdevices by forming predetermined circuit patterns in a wafer or the like as a photosensitive substrate by use of the exposure system of the foregoing embodiment will be described below with reference to the flowchart of FIG. 12.

Figure 12:
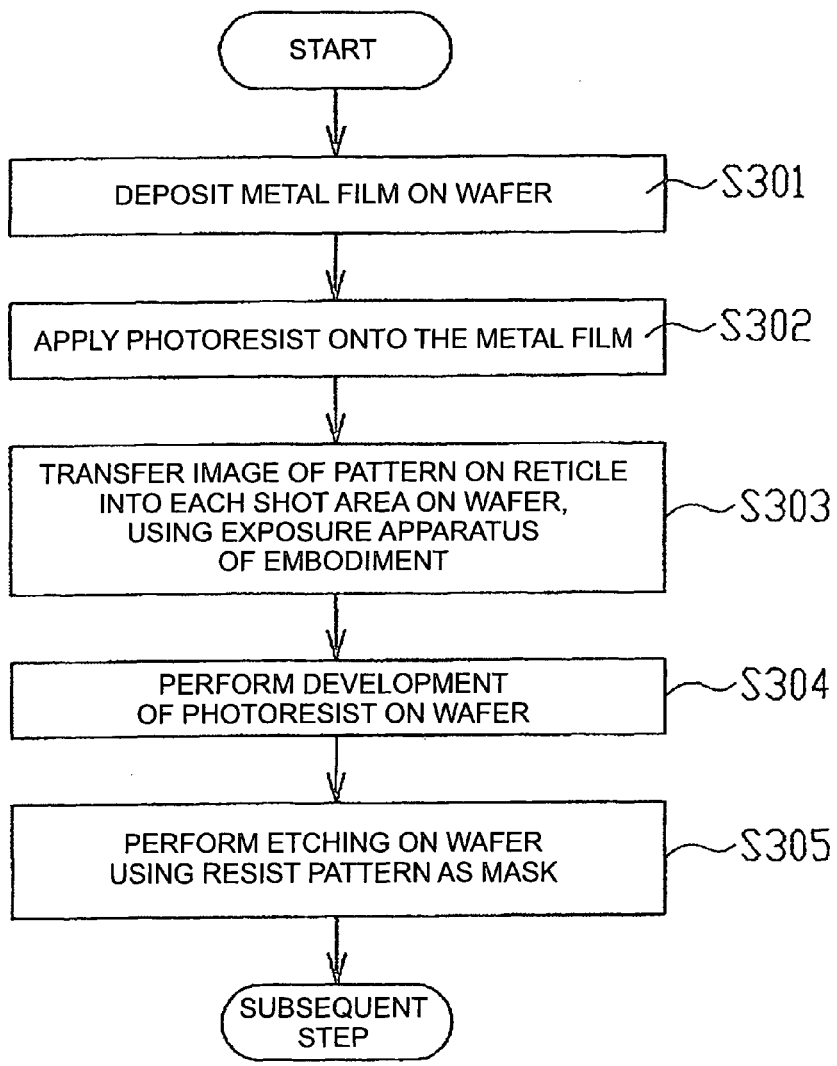
FIG. 12 is a flowchart showing a method of manufacturing semiconductor devices as microdevices according to an embodiment of the present invention.

The first step S301 in FIG. 12 is to deposit a metal film on each wafer in one lot. The next step S302 is to apply a photoresist onto the metal film on each wafer in the lot. The subsequent step S303 is to first perform scanning exposure of a pattern image on a mask in each shot area on each wafer in the lot through the projection optical system PL by means of the scanning exposure apparatus (scanner) 1A. The subsequent step S304 is to perform development of the photoresist on each wafer in the lot, and the subsequent step S305 is to perform etching on each wafer in the lot, using the resist pattern as a mask, to form a circuit pattern corresponding to the pattern on the mask, in each shot area on each wafer.

Thereafter, the operation of step S301 to step S305 is repeated using the projection exposure apparatus 1B, to implement formation of a circuit pattern of an upper layer and others to manufacture devices such as semiconductor devices. At this time, before the exposure by the projection exposure apparatus 1B, a pattern shape to be formed on the wafer by the projection exposure apparatus 1B is corrected so as to match the pattern shape of the lower layer formed by the scanning exposure apparatus 1A. Since the above-described microdevice manufacturing method is arranged to perform the exposure of the circuit pattern of the upper layer by means of the exposure system (projection exposure apparatus) of the foregoing embodiment, an overlay error of patterns formed on the wafer can be corrected with high accuracy, whereby good microdevices can be obtained.

The steps S301 to S305 were arranged to deposit the metal on the wafer, to apply the resist onto the metal film, and then to perform the steps of exposure, development, and etching, but it is needless to mention that, prior to these steps, the manufacturing method may include steps of forming an oxide film of silicon on the wafer, then applying a resist onto the oxide film of silicon, and performing the steps of exposure, development, etching, and so on.

The exposure system of the foregoing embodiment can also be applied to manufacturing a liquid-crystal display device as a microdevice by forming predetermined patterns (circuit pattern, electrode pattern, etc.) on plates (glass substrates). An example of a technique of this manufacture will be described below with reference to the flowchart of FIG. 13.

Figure 13:
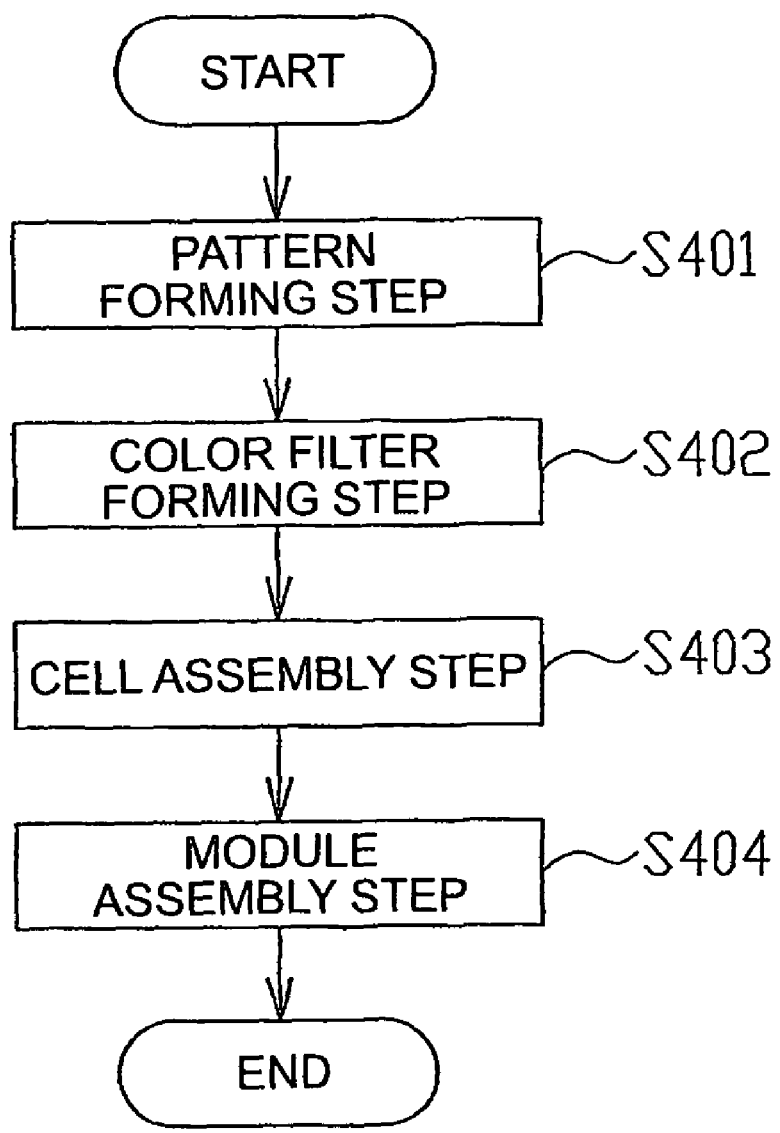
FIG. 13 is a flowchart showing a method of manufacturing a liquid-crystal display device as a microdevice according to an embodiment of the present invention.

In FIG. 13, a pattern forming step S401 is to execute a so-called photolithography step of transferring a fine pattern and a rather rough pattern or the like of masks in an overlaid state onto a photosensitive substrate (a glass substrate coated with a resist, or the like) by means of the scanning exposure apparatus (scanner) 1A and the projection exposure apparatus (stepper) 1B. At this time, before the exposure by the projection exposure apparatus 1B, a shape of a pattern to be formed on the plate exposed by the projection exposure apparatus 1B is corrected so as to match the shape of the pattern of the lower layer formed by the scanning exposure apparatus 1A.

This photolithography step results in forming predetermined patterns including a lot of electrodes and others on the photosensitive substrate. Thereafter, the exposed substrate is subjected to each of steps such as development, etching, and resist removal to form the predetermined patterns on the substrate, and then the process transfers to the next color filter forming step S402.

The next color filter forming step S402 is to form a color filter in which a number of sets of three dots corresponding to R (Red), G (Green), and B (Blue) are arrayed in a matrix pattern, or in which sets of filters of three stripes of R, G, and B are arrayed as a plurality of lines arranged in a direction of horizontal scanning lines. After the color filter forming step S402, a cell assembly step S403 is carried out. The cell assembly step S403 is to assemble a liquid crystal panel (liquid crystal cell), using the substrate with the predetermined pattern obtained in the pattern forming step S401, the color filter obtained in the color filter forming step S402, and so on. In the cell assembly step S403, for example, a liquid crystal is poured into between the substrate with the predetermined pattern obtained in the pattern forming step S401 and the color filter obtained in the color filter forming step S402 to manufacture the liquid crystal panel (liquid crystal cell).

The subsequent module assembly step S404 is to attach each of components such as an electric circuit, a backlight, etc. for display operation of the assembled liquid crystal panel (liquid crystal cell) to complete the liquid-crystal display device. Since the above-described manufacturing method of the liquid-crystal display device is arranged to perform the exposure by means of the exposure system (projection exposure apparatus) of the foregoing embodiment, an overlay error of patterns formed on the plate can be corrected with high accuracy, whereby a good semiconductor device can be obtained.

EXAMPLE

A configuration of an exposure system according to an example is the same as that according to the foregoing embodiment shown in FIG. 1, and the same reference symbols as in the description of the exposure system according to the foregoing embodiment will be used for explaining the exposure system according to the example. The projection exposure apparatus 1B according to this example uses a KrF excimer laser as an exposure light source and is well compensated for aberration in the 32×26 mm field.

Figure 14:
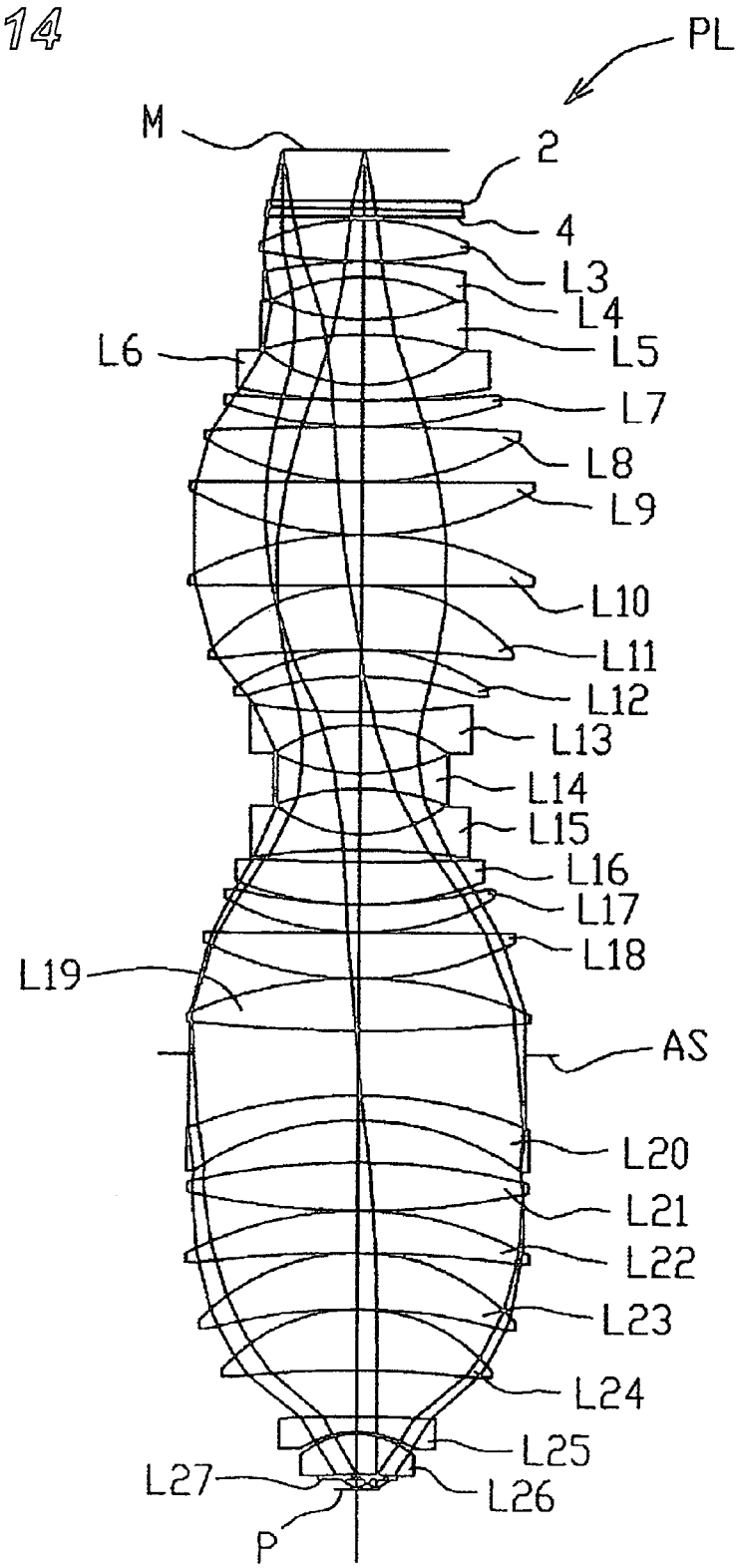
FIG. 14 is a drawing showing a lens configuration of a projection optical system according to an example.

FIG. 14 is a drawing showing a lens configuration of a projection optical system PL in the projection exposure apparatus 1B of this example. As shown in FIG. 14, the projection optical system PL of this example has a wedge prism 2 whose surface parallel to the XY plane is directed toward the mask M and whose parallel surface at the wedge angle of 1° is directed toward the substrate P (second surface), and a wedge prism 4 whose parallel surface at the wedge angle of 1° is directed toward the mask M and whose surface parallel to the XY plane is directed toward the substrate P, in the order mentioned from the mask M side (first plane side).

The projection optical system PL also has a biconvex lens L3, a negative meniscus lens L4 whose concave surface of an aspherical shape is directed toward the substrate P, a biconcave lens L5 having a concave surface of an aspherical shape on the substrate P side, a negative meniscus lens L6 whose concave surface is directed toward the mask M, a positive meniscus lens L7 whose concave surface of an aspherical shape is directed toward the mask M, a biconvex lens L8, a positive meniscus lens L9 whose concave surface is directed toward the mask M, a biconvex lens L10, a positive meniscus lens L11 whose convex surface is directed toward the mask M, a positive meniscus lens L12 whose concave surface of an aspherical shape is directed toward the substrate P, a biconcave lens L13 having a concave surface of an aspherical shape on the mask M side, a biconcave lens L14, a biconcave lens L15 having a concave surface of an aspherical shape on the substrate P side, a positive meniscus lens L16 whose concave surface of an aspherical shape is directed toward the mask M, a positive meniscus lens L17 whose concave surface is directed toward the mask M, a positive meniscus lens L18 whose concave surface is directed toward the mask M, a biconvex lens L19, an aperture stop AS, a negative meniscus lens L20 whose convex surface is directed toward the mask M, a biconvex lens L21, a positive meniscus lens L22 whose convex surface is directed toward the mask M, a positive meniscus lens L23 whose convex surface is directed toward the mask M, a positive meniscus lens L24 whose concave surface of an aspherical shape is directed toward the substrate P, a negative meniscus lens L25 whose convex surface is directed toward the mask M, a positive meniscus lens L26 whose convex surface is directed toward the mask M, and a plane-parallel plate L27.

Values of specifications of the projection optical system PL according to this example will be presented below. In the specifications, NA represents the numerical aperture. Table 1 presents the specifications of the optical members in the projection optical system PL according to this example. In the specifications of the optical members in Table 1, the surface number in the first column represents an order of a surface along the ray traveling direction from the object side, the second column the radius of curvature of each surface (mm), the third column an axial distance or surface separation (mm) of each surface, the fourth column decentering, the fifth column a glass material (glass name) of each optical member, and the sixth column a note.

Table 2 presents aspherical coefficients of lenses with a lens surface of an aspherical shape used in the projection optical system PL of this example. In Table 2, the aspherical numbers in the first column correspond to the aspherical numbers in the second column (radius of curvature) in the specifications of the optical members in Table 1. The second column represents a center curvature CURV (1/mm) of each aspherical surface, the third column a conical coefficient K and a twelfth-order aspherical coefficient, the fourth column fourth-order and fourteenth-order aspherical coefficients, the fifth column sixth-order and sixteenth-order aspherical coefficients, the sixth column eighth-order and eighteenth-order aspherical coefficients, and the seventh column tenth-order and twentieth-order aspherical coefficients.

In this example, each aspherical surface is expressed by Formula 1 below, where Y represents a height in a direction perpendicular to the optical axis of the projection optical system PL, Z a distance (sag) along the optical axis of the projection optical system PL from a tangent plane at a vertex of the aspherical surface to a position on the aspherical surface at the height Y, CURV the center curvature, K the conical coefficient, A the fourth-order aspherical coefficient, B the sixth-order aspherical coefficient, C the eighth-order aspherical coefficient, D the tenth-order aspherical coefficient, E the twelfth-order aspherical coefficient, F the fourteenth-order aspherical coefficient, G the sixteenth-order aspherical coefficient, H the eighteenth-order aspherical coefficient, and J the twentieth-order aspherical coefficient.

[Mathematical Expression 1]

$$Z = \frac{(CURV)Y^2}{1 + \{1 - (1+K)(CURV)^2 Y^2\}^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20} \quad \text{(Formula 1)}$$

(Specifications)
Image-side NA: 0.79
Exposure region: 32×25 mm rectangular region (maximum image height: 20.3 mm)
Imaging magnification: ¼×
Center wavelength: 248.0 nm
Refractive index of silica glass ($SiO_2$): 1.50839

TABLE 1

(Specifications of Optical Members)

| | Radius of curvature(mm) | Surface separation(mm) | Decentering | Glass name | Note |
|---|---|---|---|---|---|
| 1st surface | ∞ | 49.900000 | | | |
| 1 | ∞ | 7.000000 | | SiO2 | 1st wedge prism |
| 2 | ∞ | 0.100000 | X-axis rotation tilt + 1° | | |
| 3 | ∞ | 7.000000 | X-axis rotation tilt + 1° | SiO2 | 2nd wedge prism |
| 4 | ∞ | 3.000000 | | | |
| 5 | 234.05528 | 40.959284 | | SiO2 | |
| 6 | −535.81294 | 1.000000 | | | |
| 7 | 519.20988 | 15.000000 | | SiO2 | |
| 8 | ASP-1 | 42.285387 | | | |
| 9 | −234.12696 | 15.000000 | | SiO2 | |
| 10 | ASP-2 | 51.652162 | | | |
| 11 | −150.09235 | 15.000000 | | SiO2 | |
| 12 | −612.04911 | 1.000000 | | | |
| 13 | ASP-3 | 25.000000 | | SiO2 | |
| 14 | −431.14644 | 1.000000 | | | |
| 15 | 3188.45260 | 55.558874 | | SiO2 | |
| 16 | −296.06141 | 1.000000 | | | |
| 17 | −28870.70015 | 51.084089 | | SiO2 | |
| 18 | −350.00000 | 1.000000 | | | |
| 19 | 350.00000 | 51.743325 | | SiO2 | |
| 20 | −63085.50661 | 1.000000 | | | |

TABLE 1-continued (Specifications of Optical Members)

| | Radius of curvature(mm) | Surface separation(mm) | Decentering | Glass name | Note |
|---|---|---|---|---|---|
| 21 | 200.00000 | 63.161359 | | SiO2 | |
| 22 | 996.33085 | 1.000000 | | | |
| 23 | 217.19464 | 26.308720 | | SiO2 | |
| 24 | ASP-4 | 35.227187 | | | |
| 25 | ASP-5 | 15.000000 | | SiO2 | |
| 26 | 128.50880 | 49.051171 | | | |
| 27 | −182.51546 | 15.000000 | | SiO2 | |
| 28 | 199.53079 | 46.966150 | | | |
| 29 | −128.96664 | 15.000000 | | SiO2 | |
| 30 | ASP-6 | 12.552158 | | | |
| 31 | ASP-7 | 44.402393 | | SiO2 | |
| 32 | −308.07923 | 1.000000 | | | |
| 33 | −449.01813 | 28.115329 | | SiO2 | |
| 34 | −257.40781 | 1.000000 | | | |
| 35 | −7304.22282 | 44.606242 | | SiO2 | |
| 36 | −330.00000 | 1.000000 | | | |
| 37 | 415.34383 | 51.499668 | | SiO2 | |
| 38 | −1920.78001 | 24.530095 | | | |
| 39 | ∞ | 41.372901 | | | aperture stop |
| 40 | 416.55748 | 25.000000 | | SiO2 | |
| 41 | 270.00000 | 43.596645 | | | |
| 42 | 686.45793 | 48.118689 | | SiO2 | |
| 43 | −752.77245 | 1.000000 | | | |
| 44 | 348.26472 | 41.468619 | | SiO2 | |
| 45 | 1274.59292 | 1.000000 | | | |
| 46 | 209.88790 | 54.683833 | | SiO2 | |
| 47 | 524.75744 | 1.000000 | | | |
| 48 | 172.10890 | 59.833664 | | SiO2 | |
| 49 | ASP-8 | 47.879775 | | | |
| 50 | 1380.51356 | 15.000000 | | SiO2 | |
| 51 | 98.85764 | 2.128031 | | | |
| 52 | 81.82457 | 40.000000 | | SiO2 | |
| 53 | 556.22069 | 2.214250 | | | |
| 54 | ∞ | 4.000000 | | SiO2 | |
| 55 | ∞ | 10.000000 | | | |
| 2nd surface | ∞ | | | | |

TABLE 2

(Aspherical Coefficients)

| Aspherical number | Center curvature (CURV) | K / E | A / F | B / G | C / H | D / J |
|---|---|---|---|---|---|---|
| ASP-1 | 0.00616609 | 0.00000E+00 | −4.32322E−08 | −1.27505E−12 | −1.72568E−17 | −3.25194E−21 |
| | | 1.12550E−25 | −5.10622E−30 | 0.00000E+00 | 0.00000E+00 | 0.00000E+00 |
| ASP-2 | 0.00322407 | 0.00000E+00 | −2.38846E−08 | 2.61879E−12 | −5.46793E−17 | 5.61650E−21 |
| | | −3.31442E−25 | 8.07259E−30 | 0.00000E+00 | 0.00000E+00 | 0.00000E+00 |
| ASP-3 | −0.00066324 | 0.00000E+00 | −9.47644E−09 | 4.12355E−13 | −1.13124E−17 | 5.28590E−22 |
| | | −1.75187E−26 | 4.43557E−31 | 0.00000E+00 | 0.00000E+00 | 0.00000E+00 |
| ASP-4 | 0.00333650 | 0.00000E+00 | −4.12252E−09 | 3.19349E−14 | −1.20289E−17 | −3.30584E−22 |
| | | 8.06136E−27 | −2.48300E−30 | 0.00000E+00 | 0.00000E+00 | 0.00000E+00 |
| ASP-5 | −0.00092611 | 0.00000E+00 | −3.11947E−08 | 2.89619E−12 | −1.11392E−16 | 9.58084E−22 |
| | | 6.52655E−26 | −1.14294E−30 | 0.00000E+00 | 0.00000E+00 | 0.00000E+00 |
| ASP-6 | 0.00175686 | 0.00000E+00 | −1.50040E−08 | 1.66783E−12 | −1.36998E−16 | 8.69688E−21 |
| | | −3.38528E−25 | 6.68626E−30 | 0.00000E+00 | 0.00000E+00 | 0.00000E+00 |
| ASP-7 | −0.00010000 | 0.00000E+00 | −2.47825E−08 | 9.17078E−13 | −5.40013E−17 | 1.88633E−21 |
| | | −3.78900E−26 | −5.89757E−31 | 0.00000E+00 | 0.00000E+00 | 0.00000E+00 |
| ASP-8 | 0.00086846 | 0.00000E+00 | 1.17658E−08 | −1.87865E−13 | −1.06648E−18 | 1.74367E−22 |
| | | −5.08969E−27 | 6.93568E−32 | 0.00000E+00 | 0.00000E+00 | 0.00000E+00 |

Figure 15:
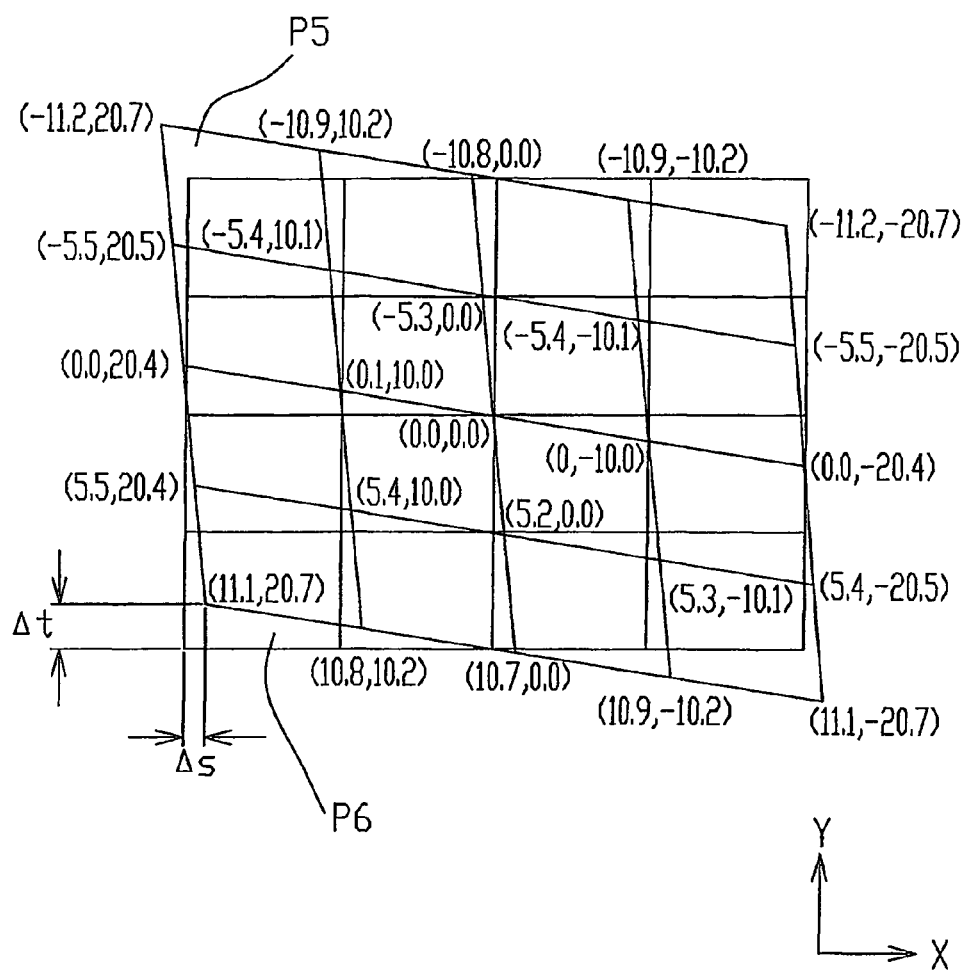
FIG. 15 is a drawing for explaining a shape of a pattern image formed with rotation around the Y-axis direction of the wedge prism according to the example.

The wedge prisms 2, 4 have the center thickness of 7 mm and the wedge angle (θ) of 1°, and FIG. 15 shows a pattern image P5 formed on the substrate P when the wedge prism (first wedge prism) 2 is rotated by 30″ (β) around the Y-axis direction. P6 in FIG. 15 shows a pattern image formed on the substrate P without rotation of the wedge prism 2. A plurality of (x,y) coordinates indicating positions in the pattern image P5 shown in FIG. 15 indicate transformation amounts from the pattern image P6 and the unit thereof is nm.

Figure 16:
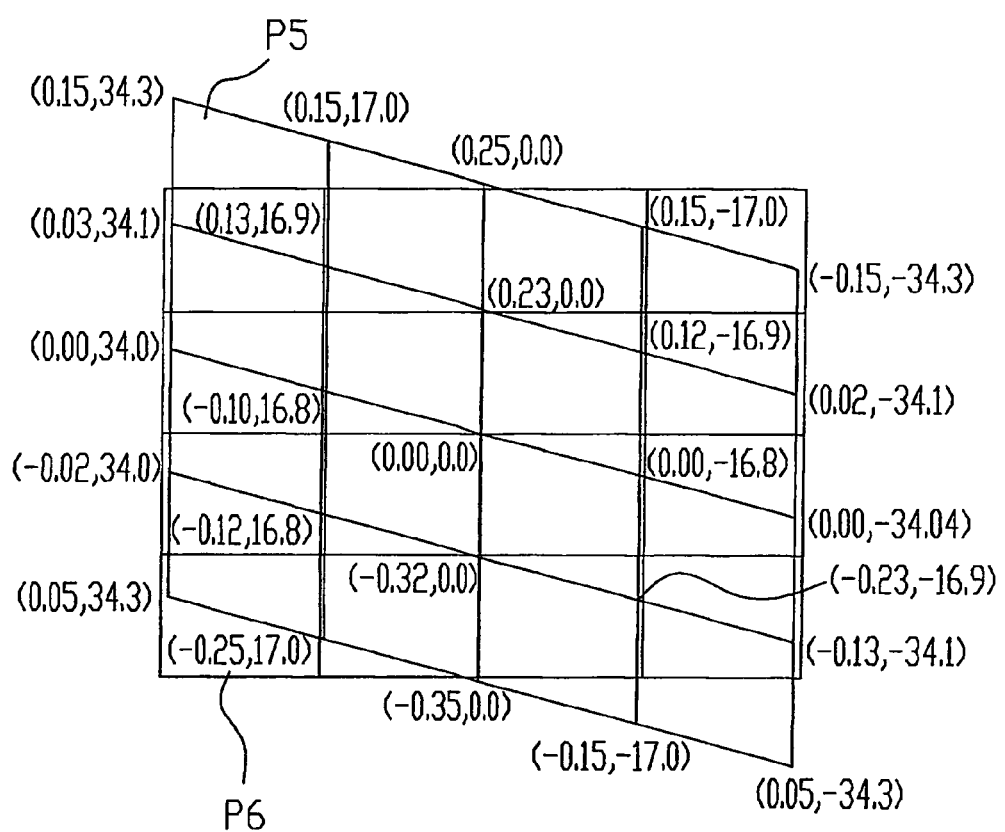
FIG. 16 is a drawing showing a rotated state of the pattern image according to the example.

From a comparison between Δt and Δs shown in FIG. 15, Δt:Δs=1.9:1.0. Next, FIG. 16 shows a pattern image P5 formed on the substrate P when the pattern image P5 (substrate stage PST) is rotated by 0.85 μrad clockwise. Similarly to FIG. 15, a plurality of (x,y) coordinates indicating positions in the pattern image P5 shown in FIG. 16 indicate transformation amounts from the pattern image P6 and the unit thereof is nm.

In a case where a deviation of 68 nm (±34 nm) occurred in the scanning direction on the occasion of the exposure of the pattern of the previous layer in the scanning exposure apparatus 1A and where a pattern of a parallelogram shape was printed instead of the rectangular pattern, the shape of the pattern exposed in the projection exposure apparatus 1B can be corrected as shown in FIG. 14, so that an overlay deviation becomes 0.3 nm or less from the shape of the parallelogram pattern of the previous layer. Namely, the shape of the pattern image P5 can be approximately matched with the shape of the pattern image of the parallelogram shape of the previous layer printed by the scanning exposure apparatus 1A.

FIG. 17 is a transverse aberration diagram showing transverse aberrations in the meridional direction and in the sagittal direction of the projection optical system PL according to this example, in which Y indicates the image height. As shown in the transverse aberration diagram of FIG. 17, the projection optical system PL of this example has the variation of wavefront aberration of not more than 5 mλRMS and the variation of field of not more than 5 nm.

The projection optical system of this example is able to achieve simple and high-accuracy correction for the overlay error of patterns through rotation of the wedge prism around the Y-axis direction, with little occurrence of aberration and without degradation of imaging performance.

INDUSTRIAL APPLICABILITY

As described above, the projection optical system, exposure apparatus, exposure system, and exposure method of the present invention are suitable for high-accuracy manufacture of microdevices such as thin-film magnetic heads and flat panel displays such as liquid-crystal display devices by lithography.

The invention claimed is:

1. A projection optical system for forming an image of a first plane on a second plane, comprising:

a first wedge prism each of an entrance surface and an exit surface of which has a plane and in which a predetermined first wedge angle is made between the plane of the entrance surface and the plane of the exit surface, wherein the first wedge prism is disposed within the projection optical system, when a coordinate system is defined so that a Z-axis direction is set along a direction of a normal to the first plane, an X-axis direction along a direction of an intersecting line between the plane of the entrance surface and the plane of the exit surface, and a Y-axis direction along a direction perpendicular to the Z-axis direction and the X-axis direction, the first wedge prism is arranged rotatably substantially around the Y-axis direction, and the first wedge prism transforms the image of the first plane imaged on the second plane from one of (1) a rectangular shape into a parallelogram shape and (2) a parallelogram shape into a rectangular shape.

2. A projection optical system according to claim 1, further comprising a second wedge prism which is disposed near the first wedge prism, each of an entrance surface and an exit surface of which has a plane, and in which a predetermined second wedge angle is made between the plane of the entrance surface and the plane of the exit surface, wherein the second wedge angle of the second wedge prism is substantially equal to the first wedge angle of the first wedge prism, and the first wedge prism and the second wedge prism are arranged so that directions of their respective wedge angles are substantially opposite to each other.

3. A projection optical system according to claim 2, wherein the second wedge prism is arranged rotatably substantially around the X-axis direction.

4. A projection optical system according to claim 2, wherein the first wedge prism and the second wedge prism are in a variable angular relation in a direction of rotation substantially around the Y-axis direction.

5. A projection optical system according to claim 1, wherein the first wedge prism is located in a substantially telecentric optical path.

6. A projection optical system according to claim 1, wherein the image of the first plane formed on the second plane is a reduced image, and the first wedge prism is disposed on the first plane side in an optical path of the projection optical system.

7. A projection optical system according to claim 6, wherein the first wedge prism is disposed nearest to the first plane in the optical path of the projection optical system, compared to the second wedge prism.

8. A projection optical system according to claim 1, wherein when a pattern of the first plane imaged on the second plane is of a rectangular shape, the X-axis direction is parallel to a longitudinal direction of the rectangular shape, and the Y-axis direction is parallel to a transverse direction of the rectangular shape.

9. A projection optical system according to claim 1, wherein when a pattern of the first plane imaged on the second plane is of a rectangular shape, a predetermined angle is made between the X-axis direction and a longitudinal direction of the rectangular shape, and the predetermined angle is made between the Y-axis direction and a transverse direction of the rectangular shape.

10. An exposure apparatus comprising:

the projection optical system according to claim 1, that projects a predetermined pattern disposed on the first plane, onto a photosensitive substrate disposed on the second plane.

11. An exposure apparatus according to claim 10, wherein the predetermined pattern is projected onto the photosensitive substrate while the photosensitive substrate is kept in a stationary state.

12. An exposure system comprising:

a first exposure apparatus comprising a first projector that forms an image of an entire first pattern region on a first pattern former, on a photosensitive substrate, and adapted to effect full-field batch exposure of the first pattern region on the first pattern former into a predetermined sectional region on the photosensitive substrate; and a second exposure apparatus comprising a second projector that forms a pattern image in a partial region of a second pattern region on a second pattern former, on the photosensitive substrate, and adapted to effect scanning exposure of a pattern in the second pattern region on the second pattern former into the predetermined sectional region on the photosensitive substrate, with relative movement of the pattern image and the photosensitive substrate;

wherein the first exposure apparatus comprises the exposure apparatus as set forth in claim 11.

13. An exposure method comprising exposing a predetermined pattern on a photosensitive substrate, using the exposure apparatus as set forth in claim 11.

14. A device manufacturing method comprising:

exposing a predetermined pattern on a photosensitive substrate, using the exposure apparatus as set forth in claim 11; and developing the photosensitive substrate.

15. An exposure apparatus with a scanning exposure apparatus, comprising:

the projection optical system according to claim 1, that forms an image of an entire first pattern region on a first pattern former, on a photosensitive substrate, wherein the exposure apparatus adapted to effect full-field batch exposure of the first pattern region on the first pattern former into a predetermined sectional region on the photosensitive substrate, and the scanning exposure apparatus further comprises another projector that forms a pattern image in a partial region of a second pattern region on a second pattern former, on the photosensitive substrate, and adapted to effect scanning exposure of a pattern in the second pattern region on the second pattern former into the predetermined sectional region on the photosensitive substrate, with relative movement of the pattern image and the photosensitive substrate.

16. An assembly according to claim 1, further comprising a second wedge prism which is disposed near the first wedge prism, each of an entrance surface and an exit surface of which has a plane, and in which a predetermined second wedge angle is made between the plane of the entrance surface and the plane of the exit surface, wherein the second wedge angle of the second wedge prism is substantially equal to the first wedge angle of the first wedge prism, and the first wedge prism and the second wedge prism are arranged so that directions of their respective wedge angles are substantially opposite to each other.

17. An assembly according to claim 16, wherein the first wedge prism is arranged rotatably substantially around the X-axis direction.

18. A projection optical system according to claim 16, wherein the second wedge prism is arranged rotatably substantially around the X-axis direction.

19. A projection optical system according to claim 16, wherein the first wedge prism and the second wedge prism are in a variable angular relation in a direction of rotation substantially around the rotation axis direction.

20. An assembly according to claim 19, wherein the rotation axis direction is the Y-axis.

21. An assembly according to claim 16, wherein the first wedge prism and the second wedge prism are arranged rotatably substantially around the X-axis direction.

22. An exposure apparatus for performing exposure of a predetermined pattern on a photosensitive substrate, comprising:
    an objective optical system that forms an image of the predetermined pattern in an exposure region on the photosensitive substrate; and
    a transformer that transforms the image formed in the exposure region,
    wherein the transformer comprises:
        an image transformer that transforms the image of the predetermined pattern formed on the photosensitive substrate; and
        a rotator that achieves a relative rotation between the image of the predetermined pattern transformed by the image transforming means, and the photosensitive substrate,
    wherein the image transformer comprises a first wedge prism each of an entrance surface and an exit surface of which has a plane and in which a predetermined first wedge angle is made between the plane of the entrance surface and the plane of the exit surface, the first wedge prism being disposed within a projection optical system;
    when a coordinate system is defined so that a Z-axis direction is set along a direction of a normal to a first plane where the predetermined pattern is located, an X-axis direction along a direction of an intersecting line between the plane of the entrance surface and the plane of the exit surface, and a Y-axis direction along a direction perpendicular to the Z-axis direction and the X-axis direction, the first wedge prism is arranged rotatably substantially around the Y-axis direction, and
    the first wedge prism transforms the image formed in the exposure region from one of (1) a rectangular shape into a parallelogram shape and (2) a parallelogram shape into a rectangular shape.

23. An exposure apparatus according to claim 22, further comprising a second wedge prism which is disposed near the first wedge prism, each of an entrance surface and an exit surface of which has a plane, and in which a predetermined second wedge angle is made between the plane of the entrance surface and the plane of the exit surface,
    wherein the second wedge angle of the second wedge prism is substantially equal to the first wedge angle of the first wedge prism, and wherein the first wedge prism and the second wedge prism are arranged so that directions of their respective wedge angles are substantially opposite to each other.

24. An exposure apparatus according to claim 22, wherein the transformer comprises a first wedge prism each of an entrance surface and an exit surface of which has a plane and in which a predetermined first wedge angle is made between the plane of the entrance surface and the plane of the exit surface,
    when a coordinate system is defined so that a Z-axis direction is set along a direction of a normal to a first plane, an X-axis direction along a direction of an intersecting line between the plane of the entrance surface and the plane of the exit surface, and a Y-axis direction along a direction perpendicular to the Z-axis direction and the X-axis direction,
    when the image formed on the exposure region is the rectangular shape, the X-axis direction and the Y-axis direction make a predetermined angle with a direction of a side of the rectangular shape, and
    the first wedge prism is arranged rotatably substantially around the Y-axis direction.

25. An exposure apparatus according to claim 22, wherein the predetermined pattern is projected onto the photosensitive substrate while the photosensitive substrate is kept in a stationary state.

26. An exposure apparatus according to claim 25, wherein the exposure apparatus is used with a scanning exposure apparatus,
    the objective optical system forms the image of an entire first pattern region on a first pattern former, on the photosensitive substrate, and
    the scanning exposure apparatus further comprises another objective optical system that forms a pattern image in a partial region of a second pattern region on a second pattern former, on the photosensitive substrate, and adapted to effect scanning exposure of a pattern in the second pattern region on the second pattern former into the predetermined sectional region on the photosensitive substrate, with relative movement of the pattern image and the photosensitive substrate.

27. An exposure system comprising:
    a first exposure apparatus comprising a first projector that forming an image of an entire first pattern region on a first pattern former, on a photosensitive substrate, and adapted to effect full-field still exposure of the first pattern region on the first pattern former into a predetermined sectional region on the photosensitive substrate; and
    a second exposure apparatus comprising a second projector for forming a pattern image in a partial region of a second pattern region on a second pattern former, on the photosensitive substrate, and adapted to effect scanning exposure of a pattern in the second pattern region on the second pattern former into the predetermined sectional region on the photosensitive substrate, with relative movement of the pattern image and the photosensitive substrate;
    wherein the first exposure apparatus comprises the exposure apparatus as set forth in claim 22.

28. An exposure method comprising exposing a predetermined pattern on a photosensitive substrate, using the exposure apparatus as set forth in claim 22.

29. A device manufacturing method comprising:
    exposing a predetermined pattern on a photosensitive substrate, using the exposure apparatus as set forth in claim 22; and
    developing the photosensitive substrate.

30. An assembly for use with a projection optical system that forms an image of a first plane on a second plane, comprising:
    a first wedge prism each of an entrance surface and an exit surface of which has a plane and in which a predetermined first wedge angle is made between the plane of the entrance surface and the plane of the exit surface,
    wherein the first wedge prism is disposed within the projection optical system,
    when a coordinate system is defined so that a Z-axis direction is set along a direction of a normal to the first plane, an X-axis direction along a direction of an intersecting line between the plane of the entrance surface and the plane of the exit surface, and a Y-axis direction along a direction perpendicular to the Z-axis direction and the X-axis direction, the first wedge prism is arranged rotatably around a rotation axis in the X-Z plane, and the first wedge prism transforms the image of the first plane imaged on the second plane from one of (1) a rectangular shape into a parallelogram shape and (2) a parallelogram shape into a rectangular shape.

31. An assembly according to claim 30, wherein the first wedge prism is located in a substantially telecentric optical path.

32. An assembly according to claim 30, wherein the image of the first plane formed on the second plane is a reduced image, and wherein the first wedge prism is disposed on the first plane side in an optical path of the projection optical system.

33. An assembly according to claim 30, wherein the first wedge prism is disposed nearest to the first plane in the optical path of the projection optical system, compared to the second wedge prism.

34. An assembly according to claim 30, wherein when a pattern of the first plane imaged on the second plane is of a rectangular shape, the X-axis direction is parallel to a longitudinal direction of the rectangular shape, and the Y-axis direction is parallel to a transverse direction of the rectangular shape.

35. An assembly according to claim 30, wherein when a pattern of the first plane imaged on the second plane is of a rectangular shape, a predetermined angle is made between the X-axis direction and a longitudinal direction of the rectangular shape, and the predetermined angle is made between the Y-axis direction and a transverse direction of the rectangular shape.

* * * * *